(12) United States Patent
Lee et al.

(10) Patent No.: US 9,658,484 B2
(45) Date of Patent: May 23, 2017

(54) PATTERN STRUCTURE AND METHOD OF MANUFACTURING THE PATTERN STRUCTURE, AND LIQUID CRYSTAL DISPLAY DEVICE

(71) Applicant: Samsung Electronics Co., Ltd., Suwon-si, Gyeonggi-do (KR)

(72) Inventors: Sunghoon Lee, Seoul (KR); Dongouk Kim, Pyeongtaek-si (KR); Joonyong Park, Suwon-si (KR); Jihyun Bae, Seoul (KR); Bongsu Shin, Seoul (KR); Jong G. Ok, Seoul (KR); Ilsun Yoon, Seongnam-si (KR); Jaeseung Chung, Suwon-si (KR); Sukgyu Hahm, Gyeongju-si (KR)

(73) Assignee: SAMSUNG ELECTRONICS CO., LTD, Gyeonggi-Do (KR)

(*) Notice: Subject to any disclaimer, the term of this patent is extended or adjusted under 35 U.S.C. 154(b) by 22 days.

(21) Appl. No.: 14/817,496

(22) Filed: Aug. 4, 2015

(65) Prior Publication Data
US 2016/0033818 A1 Feb. 4, 2016

(30) Foreign Application Priority Data
Aug. 4, 2014 (KR) ........................ 10-2014-0099977

(51) Int. Cl.
*G02F 1/1335* (2006.01)
*G02B 5/30* (2006.01)
(Continued)

(52) U.S. Cl.
CPC ..... *G02F 1/133528* (2013.01); *G02B 5/3058* (2013.01); *G02F 1/13336* (2013.01); *G03F 7/0002* (2013.01); *G02F 2001/133548* (2013.01)

(58) Field of Classification Search
CPC ....... G02B 5/3058; G02F 2001/133548; G02F 1/133528; G02F 1/13336; G03F 7/0002
See application file for complete search history.

(56) References Cited

U.S. PATENT DOCUMENTS 6,057,898 A   5/2000  Itoh et al.
7,077,992 B2* 7/2006  Sreenivasan .......... B81C 1/0046
                                                         264/259
(Continued)

FOREIGN PATENT DOCUMENTS

JP  2001143331 A  5/2001
JP  2003043954 A  2/2003
(Continued)

OTHER PUBLICATIONS

Extended European Search Report for Application No. 15179658.8-1903 dated Nov. 17, 2015.

*Primary Examiner* — Paul Lee
*Assistant Examiner* — Jia Pan
(74) *Attorney, Agent, or Firm* — Cantor Colburn LLP

(57) ABSTRACT

A pattern structure includes a plurality of pattern structure units arranged on a same plane, where each of the plurality of pattern structure units includes a plurality of microstructures defined on a surface thereof and having a width of less than about 1 micrometer (μm); and a connection layer disposed between the plurality of pattern structure units and having a width of less than about 10 μm, where the connection layer connects the plurality of pattern structure units to each other.

17 Claims, 18 Drawing Sheets

(51) Int. Cl.
*G03F 7/00* (2006.01)
*G02F 1/1333* (2006.01)

(56) References Cited

U.S. PATENT DOCUMENTS

| | | | |
|---|---|---|---|
| 7,906,058 B2 * | 3/2011 | GanapathiSubramanian | B29C 33/444 156/60 |
| 8,187,797 B2 * | 5/2012 | Shiobara | B82Y 10/00 264/313 |
| 2005/0159019 A1 * | 7/2005 | Lee | B82Y 10/00 438/800 |
| 2008/0299467 A1 * | 12/2008 | Kim | B82Y 10/00 430/5 |
| 2012/0049417 A1 * | 3/2012 | Inanami | G03F 7/0002 264/496 |
| 2012/0140148 A1 * | 6/2012 | Kadowaki | G02B 5/3058 349/64 |
| 2013/0153534 A1 * | 6/2013 | Resnick | B29D 11/0074 216/24 |
| 2013/0241107 A1 | 9/2013 | Ermochkine et al. | |
| 2014/0093692 A1 * | 4/2014 | Miyazawa | B29D 11/00336 428/156 |
| 2015/0321415 A1 * | 11/2015 | Lee | G03F 7/0002 428/167 |

FOREIGN PATENT DOCUMENTS

| KR | 100785035 B1 | 12/2007 |
|---|---|---|
| KR | 100854815 B1 | 8/2008 |
| KR | 1020080099408 A | 11/2008 |

* cited by examiner

PATTERN STRUCTURE AND METHOD OF MANUFACTURING THE PATTERN STRUCTURE, AND LIQUID CRYSTAL DISPLAY DEVICE

CROSS-REFERENCE TO RELATED APPLICATIONS

This application claims priority to Korean Patent Application No. 10-2014-0099977, filed on Aug. 4, 2014, and all the benefits accruing therefrom under 35 U.S.C. §119, the content of which in its entirety is herein incorporated by reference.

BACKGROUND

1. Field

The disclosure relates to a large-sized pattern structure and a method of manufacturing the large-sized pattern structure, and a liquid crystal display device having a metal wire grid polarizer manufactured using the large-sized pattern structure.

2. Description of the Related Art

A nano- or micro-sized pattern may be formed at low costs and via a simple process by using an imprint technology. Thus, much research has been performed in this regard. In a conventional imprint process, a master on which a pattern of a desirable size is formed, a stamp, and imprint resin for transferring the pattern are typically used. Recently, as demands for transferring a pattern of a uniform and large size have increased, efforts to realize a large-size imprint process have been undertaken. To transfer a uniform, large-sized pattern, a technology to manufacture a defect-free master or stamp has been used.

In this regard, a typical example of a polarizer is a polyvinyl alcohol ("PVA") polarizer that is an absorptive polarizer used for a thin film transistor-liquid crystal display ("TFT-LCD"). The PVA polarizer is disposed on each of an upper glass and a lower glass of a panel and transmits or blocks incoming light from a back light unit ("BLU"), to drive the panel. On the other hand, a metal wire grid polarizer ("WGP") that is a reflective polarizer characteristically reflects S-polarized waves and transmits P-polarized waves, unlike the absorptive polarizer that absorbs S-polarized waves and transmits P-polarized waves. Accordingly, when the metal WGP is applied to a TFT-LCD, the S-polarized waves reflected from a surface of the metal WGP are recycled, thereby improving brightness of the TFT-LCD and reducing the costs for a light source. Thus, as the size of a display panel gradually increases, a large-sized metal WGP is desired to be manufactured.

SUMMARY

Exemplary embodiments relate to a large-sized pattern structure and a manufacturing method thereof, and a liquid crystal display device having a metal wire grid polarizer manufactured by using the large-sized pattern structure.

According to an exemplary embodiment, a pattern structure includes a plurality of pattern structure units arranged on a same plane, where each of the plurality of pattern structure units includes a plurality of microstructures defined on a surface thereof and each having a width of less than about 1 micrometer (µm), and a connection layer disposed between the plurality of pattern structure units and having a width of less than about 10 µm, where the connection layer connects the plurality of pattern structure units to each other.

In an exemplary embodiment, the plurality of microstructures may be arranged substantially parallel to each other with regular intervals.

In an exemplary embodiment, a surface of each of the plurality of pattern structure units, which is connected to the connection layer, may have a maximum roughness of less than about 10 µm.

In an exemplary embodiment, a vertical step difference between surfaces of the plurality of pattern structure units may be less than about 10% of the width of each of the plurality of microstructures.

In an exemplary embodiment, the connection layer may include a thermosetting resin or a photocurable resin.

In an exemplary embodiment, the connection layer may include a thermo-shrinking resin or a photo-shrinking resin.

In an exemplary embodiment, the plurality of pattern structure units may include silicon (Si) or glass.

In an exemplary embodiment, the plurality of pattern structure units may be arranged substantially in a matrix form.

According to another exemplary embodiment, a method of manufacturing a pattern structure includes preparing a plurality of pattern structure units, where a plurality of microstructures, each of which has a width of less than about 1 µm, are defined on a surface of each of the plurality of pattern structure units, arranging the plurality of pattern structure units on a same plane to be adjacent to one another, and providing a connection layer formed of a resin between the plurality of pattern structure units to combine the plurality of pattern structure units with each other.

In an exemplary embodiment, an interval between adjacent bonding surfaces of the plurality of pattern structure units may be less than about 10 µm.

In an exemplary embodiment, a surface of each of the plurality of pattern structure units, which is connected to the connection layer, may have a maximum roughness of less than about 10 µm.

In an exemplary embodiment, a vertical step difference between surfaces of the plurality of pattern structure units may be less than about 10% of the width of each of the plurality of microstructures.

In an exemplary embodiment, a viscosity of the resin may be less than about 1000 centipoises (cps).

In an exemplary embodiment, the resin may include a thermosetting resin or a photocurable resin.

In an exemplary embodiment, the resin may include a thermo-shrinking resin or a photo-shrinking resin.

In an exemplary embodiment, the providing the connection layer may include inserting the resin between the plurality of pattern structure units using a capillary phenomenon, and forming the connection layer by curing or shrinking the predetermined resin.

In an exemplary embodiment, the preparing the plurality of pattern structure units may include cutting a plurality of pattern wafers having a surface on which the plurality of microstructures is defined.

In an exemplary embodiment, the cutting the plurality of pattern wafers may include performing an etching process, a laser process, or a polishing process.

According to another exemplary embodiment, a liquid crystal display device includes a first substrate, a second substrate disposed opposite to the first substrate, a liquid crystal layer interposed between the first and second substrates, a metal wire grid polarizer disposed on the first substrate, a black matrix disposed on the second substrate, and a color filter disposed on the second substrate. In such an embodiment, the metal wire grid polarizer includes a plurality of pattern areas, where a plurality of metal wire patterns, each of which has a width of less than about 1 µm, are disposed on a surface of each of the plurality of pattern areas, and a seam area defined between the plurality of pattern areas, where a width of the seam area is less than about 10 µm, and a position of the seam area corresponds to the black matrix.

In an exemplary embodiment, the seam area may have a width less than a width of the black matrix.

In an exemplary embodiment, the liquid crystal display device may further include a backlight unit disposed on the first substrate.

According to another exemplary embodiment, a wire grid polarizer includes a plurality of pattern areas each including a plurality of metal wire patterns having a width of less than about 1 µm, and a seam area defined between the plurality of pattern areas, wherein a width of the seam area is greater than the width of the metal wire patterns.

In an exemplary embodiment, the width of the seam area may be less than about 10 µm.

In an exemplary embodiment, the metal wire patterns may be aluminum (Al).

In an exemplary embodiment, the wire grid polarizer may further include a substrate on which the plurality of patterns areas are provided.

In an exemplary embodiment, the substrate may be glass.

BRIEF DESCRIPTION OF THE DRAWINGS

These and/or other features of the invention will become apparent and more readily appreciated from the following detailed description of embodiments thereof, taken in conjunction with the accompanying drawings, in which.

DETAILED DESCRIPTION

Figure 1:
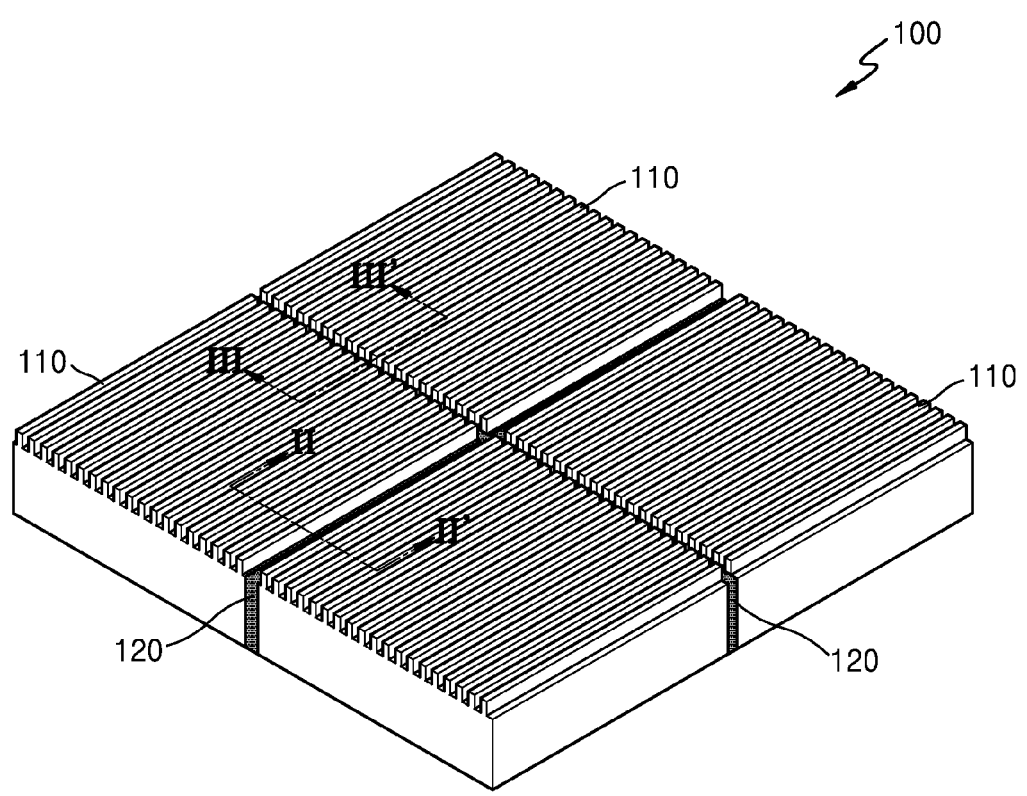
FIG. 1 is a perspective view illustrating an exemplary embodiment of a pattern structure.

The embodiments now will be described more fully hereinafter with reference to the accompanying drawings. The inventive concept may, however, be embodied in many different forms, and should not be construed as limited to the embodiments set forth herein. Rather, these embodiments are provided so that this disclosure will be thorough and complete, and will fully convey inventive principle to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, exemplary embodiments will be described in detail with reference to the accompanying drawings.

Figure 2:
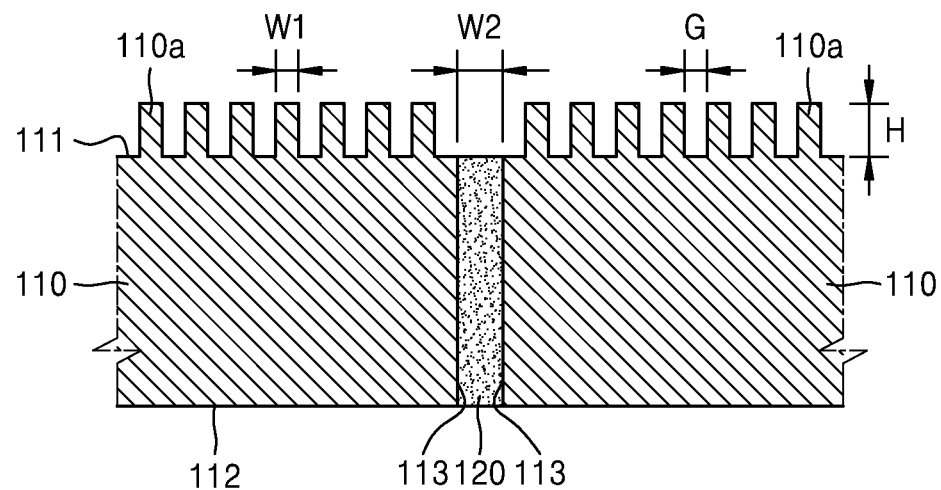
FIG. 2 is a cross-sectional view taken along line II-II' of FIG. 1.
Figure 3:
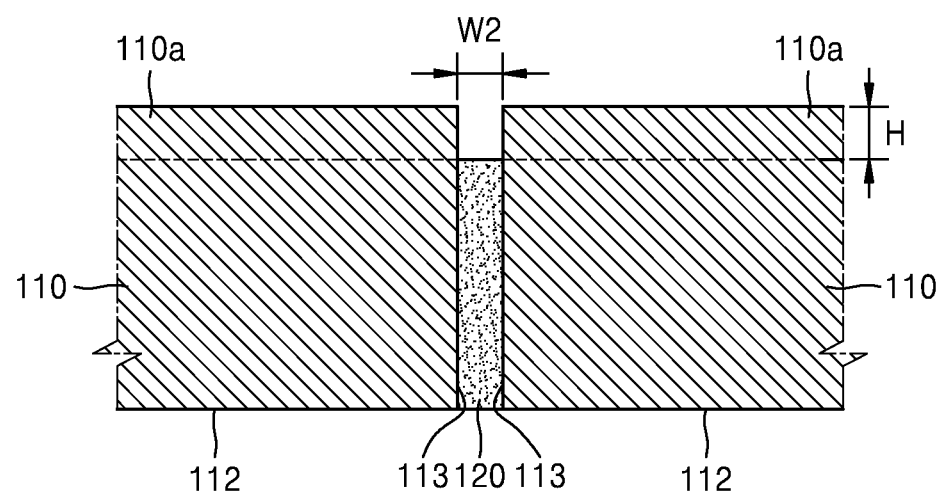
FIG. 3 is a cross-sectional view taken along line III-III' of FIG. 1.

FIG. 1 is a perspective view illustrating an exemplary embodiment of a pattern structure. FIG. 2 is a cross-sectional view taken along line II-II' of FIG. 1. FIG. 3 is a cross-sectional view taken along line III-III' of FIG. 1.

Referring to FIGS. 1 to 3, an exemplary embodiment of the pattern structure 100 may include a plurality of pattern structure units 110 arranged on a same plane (e.g., an imaginary plane) and a connection layer 120 disposed between the pattern structure units 110. In such an embodiment, a surface of each of the pattern structure units 110 may be disposed substantially in the same plane. In one exemplary embodiment, the pattern structure units 110 may include, for example, silicon (Si) or glass, but they are not limited thereto.

In an exemplary embodiment, the pattern structure units 110 each include a plurality of microstructures 110a that protrude from a first surface 111 thereof, e.g., an upper surface in FIG. 1. A second surface 112 of the pattern structure units 110, e.g., a lower surface in FIG. 1, which is an opposite surface to the first surface 111, may have a flat shape. In such an embodiment, the second surface 112 of the pattern structure units 110 may be arranged substantially in the same plane. A width W1 of each of the microstructures 110a may be less than about 1 micrometer (μm). In one exemplary embodiment, for example, the micro structures 110a, each having the width W1 less than about 1 μm, may be parallelly and cyclically arranged on the first surface 111 of each of the pattern structure units 110.

In one exemplary embodiment, for example, at least a portion of the micro structures 110a in each pattern structure unit 110 may be arranged substantially parallel to each other with regular intervals or a constant pitch. In one exemplary embodiment, for example, the micro structures 110a in a pattern structure unit 110 may define a plurality of unit pattern, in which the micro structure 110a are arranged substantially parallel to each other with regular intervals or a constant pitch. In one exemplary embodiment, for example, the micro structures 110a in a pattern structure unit 110 may be arranged substantially parallel to each other, and the micro structures 110a in different pattern structure units 110 may extend in different direction from each other, respectively.

In one exemplary embodiment, for example, the micro structures 110a in different pattern structure units 110 may be substantially perpendicular to each other. In one exemplary embodiment, for example, the micro structures 110a may be arranged substantially parallel to each other with regular intervals or a constant pitch in each pattern structure unit 110. Herein, pitch is defined as a distance between two adjacent micro structures 110a. In such an embodiment, the micro structures 110a may extend substantially in a predetermined same direction. In one exemplary embodiment, for example, the micro structures 110a in the pattern structure 100 may be substantially parallel to each other. In such an embodiment, a pitch of the micro structures 110a or a gap G between two adjacent micro structures 110a in a pattern structure unit 110 may be less than about 1 μm, and a height H of each of the micro structures 110a may be less than about 1 μm. In an alternative exemplary embodiment, the shape or size of each of the micro structures 110a and the arrangement of the micro structures 110a may be variously modified.

The pattern structure unit 110 may be manufactured, for example, by patterning a wafer including silicon or glass through an etching in a semiconductor process. In such an embodiment, the microstructures 110a, each having the width W1 of less than about 1 μm, may be provided or formed by a patterning in the semiconductor process.

The pattern structure units 110 are arranged on substantially the same plane and to be substantially close to one another, e.g., with a distance less than about 10 μm. In an exemplary embodiment, the pattern structure units 110 may be arranged substantially in a matrix form. In such an embodiment, as shown in FIG. 1, the pattern structure units 110 may be arranged in two dimensions, e.g., 2×2 matrix. the pattern structure units 110 may be arranged in one dimension, e.g., 1×2 or 1×3 matrix, in an alternative exemplary embodiment. The connection layer 120 is provided between the pattern structure units 110. The connection layer 120 is combined with the pattern structure units 110 to connect adjacent pattern structure units 110 with each other. In one exemplary embodiment, for example, a width W2 of the connection layer 120 may be less than about 10 μm. The width W2 of the connection layer 120 may be greater than the width W1 of the microstructures 110a.

In an exemplary embodiment, the connection layer 120 may include a thermosetting resin or a photocurable resin. In such an embodiment, the thermosetting resin or photocurable resin may include, for example, an acrylate-based material, but it is not limited thereto. In an exemplary embodiment, the connection layer 120 may include a thermo-shrinking resin or a photo-shrinking resin. In such an embodiment, the thermo-shrinking resin or photo-shrinking resin may include, for example, a polyurethane-based material.

Surfaces 113 of the pattern structure units 110 that are facing each other and combined by the connection layer 120 (hereinafter, bonding surfaces) may have a predetermined surface roughness. In an exemplary embodiment, the predetermined surface roughness may be determined to allow a distance between the adjacent bonding surfaces 113 of the pattern structure units 110 to be less than about 10 μm. The bonding surfaces 113 of the pattern structure units 110 are provided or formed by cutting a pattern wafer (not shown) where the microstructures 110a are on a surface thereof, as described below. In such an embodiment, the bonding surfaces 113 of the pattern structure units 110 that are formed by cutting a pattern wafer may have the predetermined surface roughness. In one exemplary embodiment, for example, the bonding surfaces 113 of the pattern structure units 110 each may have a maximum roughness Rmax that is less than about 10 μm. The maximum roughness Rmax is a value indicating a degree of surface roughness corresponding to (e.g., proportional to) a level (or height) distance between the lowest position and the highest position on a surface.

In such an embodiment, where the bonding surfaces 113 of the pattern structure units 110 having a predetermined surface roughness are arranged close to (e.g., to contact with) one another, an empty space may be provided or defined between the bonding surfaces 113 of the pattern structure units 110. In such an embodiment, the empty space is filled with a predetermined resin, and the connection layer 120 is thereby formed using the predetermined resin. In such an embodiment the bonding surfaces 113 of the pattern structure units 110 may have the same surface roughness as each other, or the bonding surfaces 113 may have different surface roughness from each other. In an exemplary embodiment, the maximum interval between the bonding surfaces 113 of the pattern structure units 110 may be less than about 10 μm. Accordingly, in such an embodiment, the connection layer 120 provided between the pattern structure units 110 may have a width of less than about 10 μm.

Figure 4A:
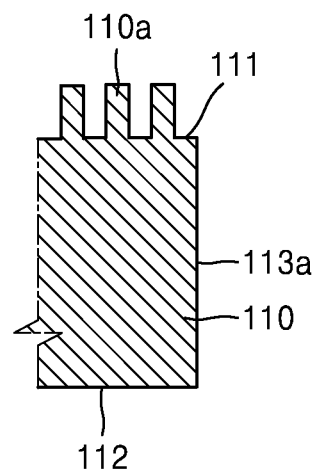
FIGS. 4A to 4D are cross-sectional views illustrating shapes of bonding surfaces of a pattern structure unit, in the pattern structure of FIG. 1.
Figure 4B:
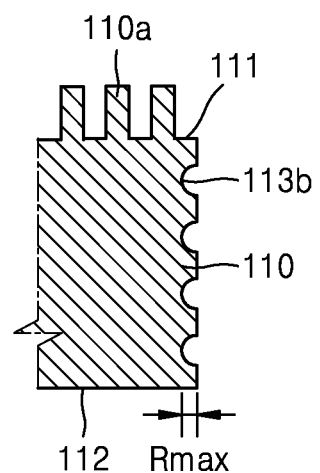
Figure 4C:
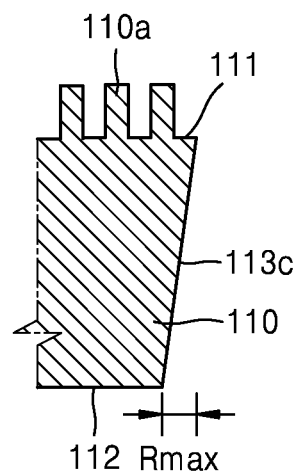
Figure 4D:
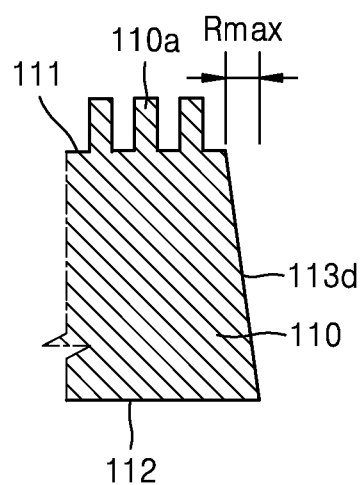

FIGS. 4A to 4D exemplarily illustrate shapes of bonding surfaces defined at the pattern structure unit 110 in the pattern structure 100 of FIG. 1. In an exemplary embodiment, as shown in FIG. 4A, a bonding surface 113a is substantially perpendicular to the first surface 111 or the second surface 112 of the pattern structure unit 110 and to be substantially flat such that the maximum roughness Rmax thereof may be close to about zero (0) μm. In an alternative exemplary embodiment, as shown in FIG. 4B, a bonding surface 113b is substantially perpendicular to the first surface 111 or the second surface 112 of the pattern structure unit 110 and may have a wavy shape or a concave surface portion. The maximum roughness Rmax of the bonding surface 113b may be less than about 10 μm. In an exemplary embodiment, as shown in FIGS. 4C and 4D, a bonding surface 113c and a bonding surface 113d are inclined with respect to the first surface 111 or the second surface 112 of the pattern structure unit 110. The maximum roughness Rmax of the bonding surfaces 113c and 113d may be less than about 10 μm. The shapes of the bonding surfaces is not limited to the shapes of exemplary embodiments 113a, 113b, 113c and 113d described above, and may be modified to have various shapes.

As such, the pattern structure units 110, on each of which the microstructures 110a having the width W1 of less than about 1 μm are formed, are combined with one another via the connection layer 120 and thus the pattern structure 100 having a large size may be effectively manufactured. In such an embodiment, where the connection layer 120 is have a width of less than about 10 μm, a sense of disconnection in a seam portion may be effectively prevented or substantially reduced when applied to a display device.

Recently, as the size of a liquid crystal display ("LCD") panel gradually increases, a metal WGP applied to the LCD panel manufactured to be a large size may be used for such a large-sized LCD. To manufacture the metal WGP in a large size, a master for manufacturing a metal WGP is also manufactured in a large size. Conventionally, a master having a large diagonal size equal to or more than about 12 inches may not be effectively manufactured without defects. In an exemplary embodiment, the pattern structure 100 is used as the master, such that a metal WGP having uniform physical properties across the entire area without defects may be embodied in a large size, e.g., having a large diagonal size greater than 12 inches.

Figure 5:
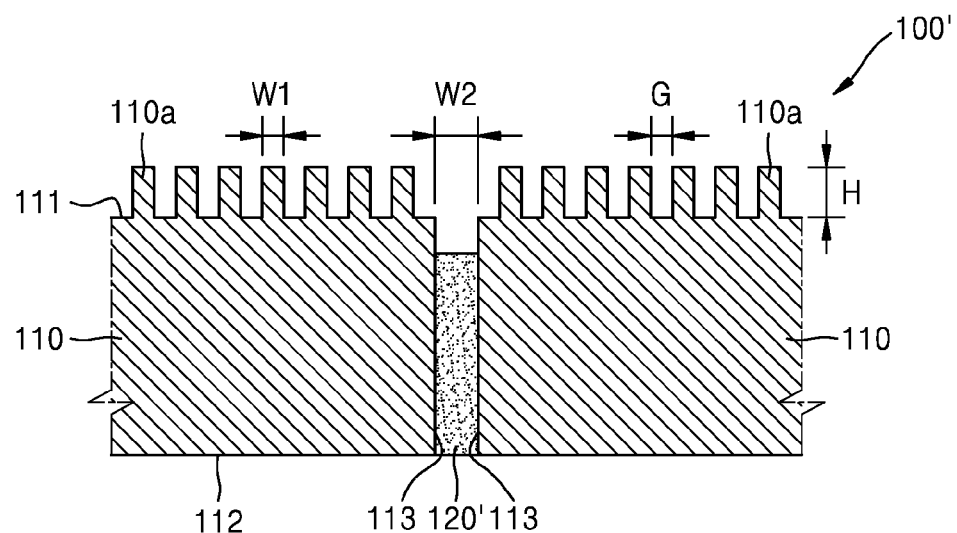
FIG. 5 is a cross-sectional view illustrating an alternative exemplary embodiment of a pattern structure.

FIG. 5 is a cross-sectional view illustrating an alternative exemplary embodiment of a pattern structure. The cross-sectional view in FIG. 5 is substantially the same as the cross-sectional view shown in FIG. 3 except for the connection layer 120, and any repetitive detailed description thereof will hereinafter be omitted or simplified.

Referring to FIG. 5, in an exemplary embodiment, the pattern structure 100' may include a plurality of pattern structure units 110 disposed on the same plane and a connection layer 120' disposed between the pattern structure units 110 and combining the pattern structure units 110. The pattern structure units 110 each include the microstructures 110a that protrude from the first surface 111. The micro structures 110a each have a width of less than about 1 μm, and the connection layer 120 may have a width of less than about 10 μm, but greater than the width of the microstructures 110a. In such an embodiment, the bonding surfaces 113 of the pattern structure units 110 each may have the maximum roughness Rmax that is less than about 10 μm.

In an exemplary embodiment, as shown in FIG. 2, the connection layer 120 may fill the entire space between the bonding surfaces 113 of the pattern structure units 110. Accordingly, as shown in FIG. 2, the first surface 111 of the pattern structure unit 110 and the upper surface of the connection layer 120 may have the same level or height or be disposed in a same plane. In an alternative exemplary embodiment, as shown in FIG. 5, the connection layer 120' may fill only a part of the space between the bonding surfaces 113 of the pattern structure units 110. In such an embodiment, as illustrated in FIG. 5, an upper surface of the connection layer 120' may be lower than the first surface 111, that is, the upper surface, of the pattern structure unit 110. In an exemplary embodiment, as shown in FIG. 5 the connection layer 120 may be in a lower portion of the space between the pattern structure units 110, but it is not limited thereto. In an alternative exemplary embodiment, the connection layer 120' may be disposed in another part, for example, an upper portion or a middle portion, of the space between the pattern structure units 110.

Figure 6:
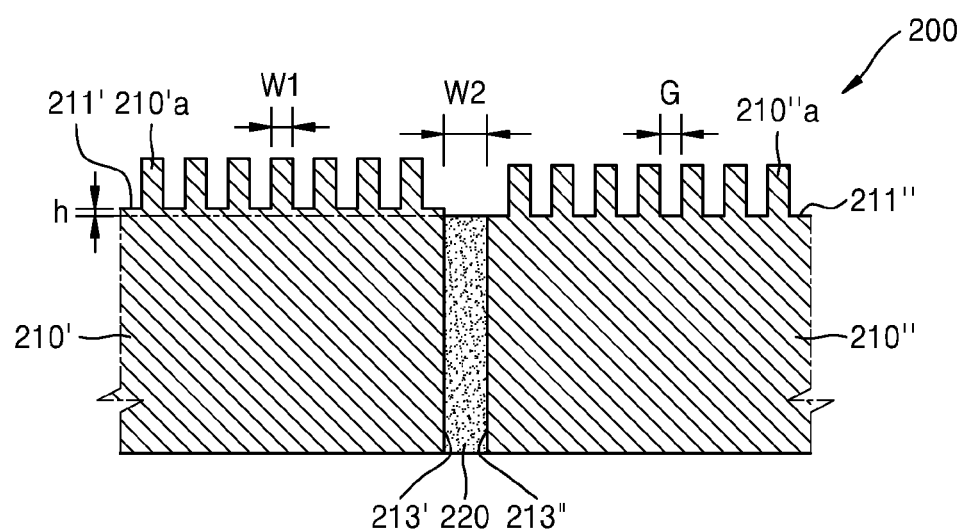
FIG. 6 is a cross-sectional view illustrating another alternative exemplary embodiment of a pattern structure.

FIG. 6 is a cross-sectional view illustrating another alternative exemplary embodiment of a pattern structure. The cross-sectional view in FIG. 5 is substantially the same as the cross-sectional view shown in FIG. 2 except for a vertical step difference between the pattern structure units 210 and 210', and any repetitive detailed description thereof will hereinafter be omitted or simplified.

Referring to FIG. 6, in an exemplary embodiment, the pattern structure 200 may include a plurality of pattern structure units 210' and 210" disposed substantially on the same plane, and a connection layer 220 disposed between the pattern structure units 210' and 210" and combining the pattern structure units 210' and 210". The pattern structure units 210' and 210" each include microstructures 210'a and 210"a that protrude from first surfaces 211' and 211". The micro structures 210' and 210" each have a width of less than about 1 μm, and the connection layer 220 may have a width of less than about 10 μm, but greater than the width of the microstructures 210' and 210". In such an embodiment, the bonding surfaces 213' and 213" of the pattern structure units

210' and 210" each may have the maximum roughness Rmax that is less than about 10 μm.

In an exemplary embodiment, as shown in FIG. 2, no vertical step difference exists between the pattern structure units 110 arranged on the same plane. In an alternative exemplary embodiment, as illustrated in FIG. 6, a predetermined vertical step difference may exist between the pattern structure units 210' and 210" when the pattern structure units 210' and 210 are arranged on the same plane, e.g., arranged to allow lower surfaces thereof to be in the same plane. The vertical step difference may be generated due to a process error in a process of forming the microstructures 210'$a$ and 210"$a$ through the etching in a semiconductor process.

In an exemplary embodiment, a vertical step difference between the first surfaces of the pattern structure units (e.g., any two pattern structure units) may be less than, for example, about 10% of a width of each of the microstructures. In such an embodiment, a vertical step difference h between the first surfaces 211' and 211" of the pattern structure units 210' and 210" combined by the connection layer 220 may be less than, for example, about 10% of a width of each of the microstructures 210'$a$ and 210"$a$. In such an embodiment, the vertical step difference h may be less than about 0.1 μm, for example. In an exemplary embodiment, the vertical step difference h between the pattern structure units 210' and 210" is less than about 10% of the width of each of the microstructures 210'$a$ and 210"$a$, such that the pattern structure 200 having a large size may be embodied without defects.

FIGS. 7 to 13 are views showing an exemplary embodiment of a method of manufacturing a pattern structure.

Figure 7:
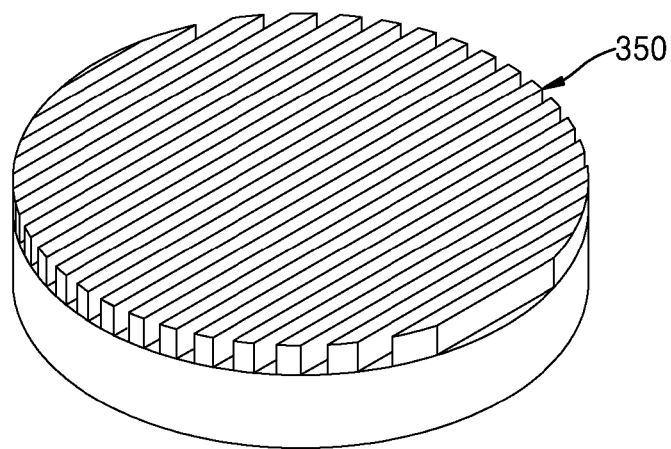
FIGS. 7 to 13 are perspective views showing an exemplary embodiment of a method of manufacturing a pattern structure.

Referring to FIG. 7, in an exemplary embodiment, a plurality of pattern wafers 350, each including the microstructures 110$a$ defined on an upper surface thereof as shown in FIG. 2, are prepared. The pattern wafers 350, for example, may be manufactured by patterning a wafer (not shown) including silicon or glass through the etching during a semiconductor process. A plurality of microstructures each having a width of less than about 1 μm may be formed by the patterning during the semiconductor process.

In an exemplary embodiment, the microstructures may be arranged substantially parallel to each other on the pattern wafer 350 and may have a width of less than about 1 μm. In such an embodiment, an interval between the microstructures may be less than about 1 μm and a height of each of the microstructures may be less than about 1 μm. In such an embodiment, the microstructures may be arranged with regular intervals. However, in an alternative exemplary embodiment, the microstructures may be variously modified to have shapes different from the shapes described herein.

Figure 8:
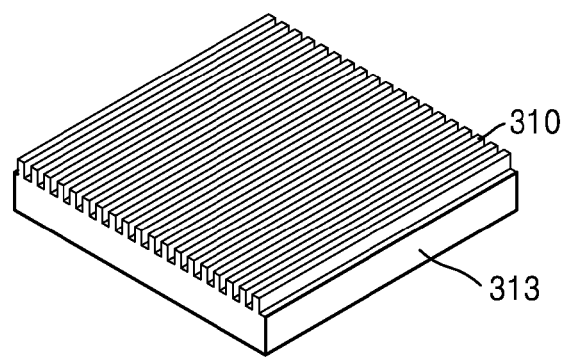

Referring to FIG. 8, in an exemplary embodiment, a plurality of pattern structure units 310 are manufactured by cutting the pattern wafers 350 in a predetermined shape. In one exemplary embodiment, the pattern wafer 350 may be cut, for example, in a rectangular shape as shown in FIG. 8. In an alternative exemplary embodiment, the pattern wafer 350 may be cut to have a polygonal shape or a fan shape, for example. The cutting of the pattern wafer 350 may be performed by, for example, an etching process, a laser processing process, or a polishing process. The laser processing process may include laser cutting or laser dicing.

In an exemplary embodiment, when the pattern structure units 310 is manufactured by cutting the pattern wafers 350, cut surfaces 313 of the pattern structure units 310 may have a predetermined surface roughness. The cut surfaces 313 of the pattern structure units 310 defines the bonding surfaces provided to be combined by a connection layer 320 shown in FIG. 13, as described above. The cut surface 313 of the pattern structure unit 310 may have the maximum roughness Rmax that is less than about 10 μm. As described above, the maximum roughness Rmax is a value indicating a degree of surface roughness corresponding to (e.g., proportional to) a distance between the lowest position and the highest position on a surface. In such an embodiment, the cut surfaces 313 of the pattern structure units 310 may have the same surface roughness as each other, or may have different surface roughness from each other.

Figure 9:
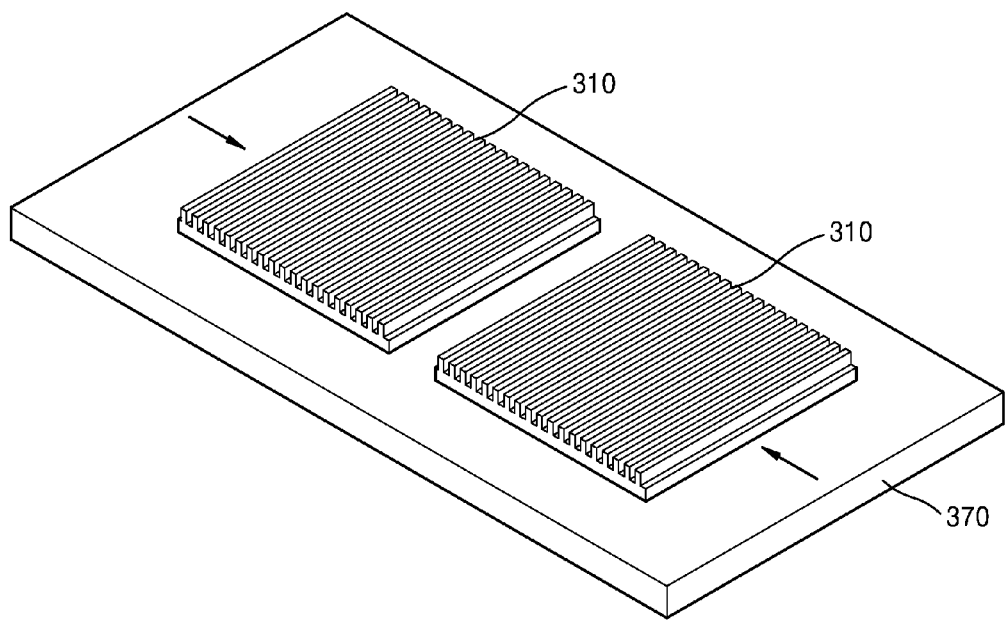

Referring to FIG. 9, in an exemplary embodiment, the pattern structure units 310 are arranged on a substrate 370, e.g., on a flat surface thereof. The pattern structure units 310 may be disposed on the substrate 370 such that a lower surface of each of the pattern structure units 310 contacts the substrate 370. In such an embodiment, as described above, a vertical step difference may exist or may not exist between the pattern structure units 310 that are arranged on the substrate 370. In such an embodiment, the vertical step difference between the pattern structure units 310 may be less than about 10% of the width of each of the microstructures.

Figure 10:
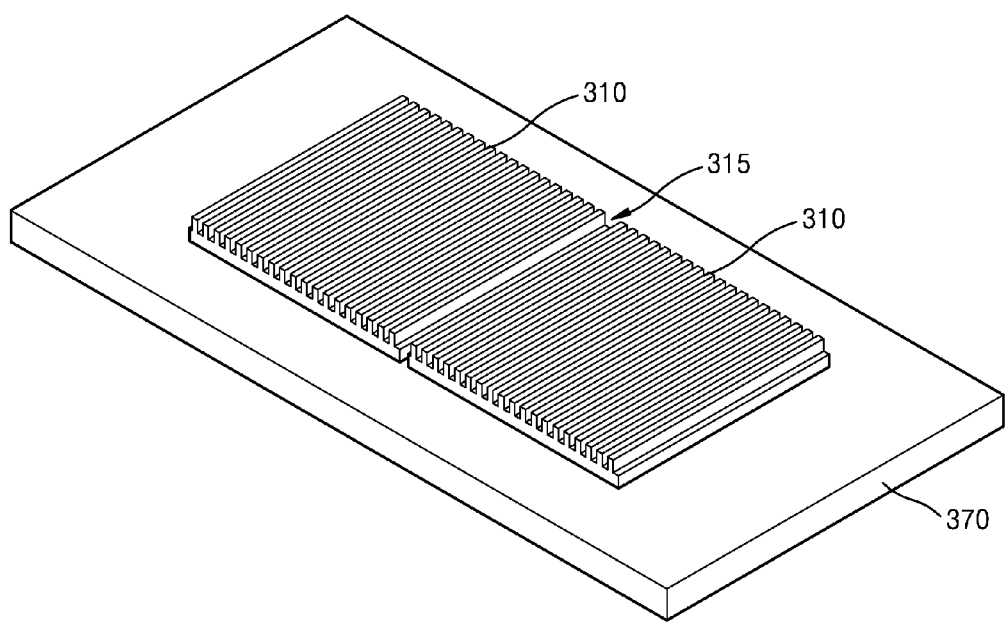

Next, referring to FIG. 10, the pattern structure units 310 that are arranged on the substrate 370 may be moved to be arranged substantially close to each other, e.g., as close to each other as possible. Since the cutting surfaces 313 of the pattern structure units 310 have a predetermined surface roughness, an empty space 315 may be provided between the cutting surfaces 313 when the cutting surfaces 313 are moved substantially close to each other. The maximum interval between the cutting surfaces 313 of the pattern structure units 310 adjacent to each other may be less than about 10 μm.

Figure 11:
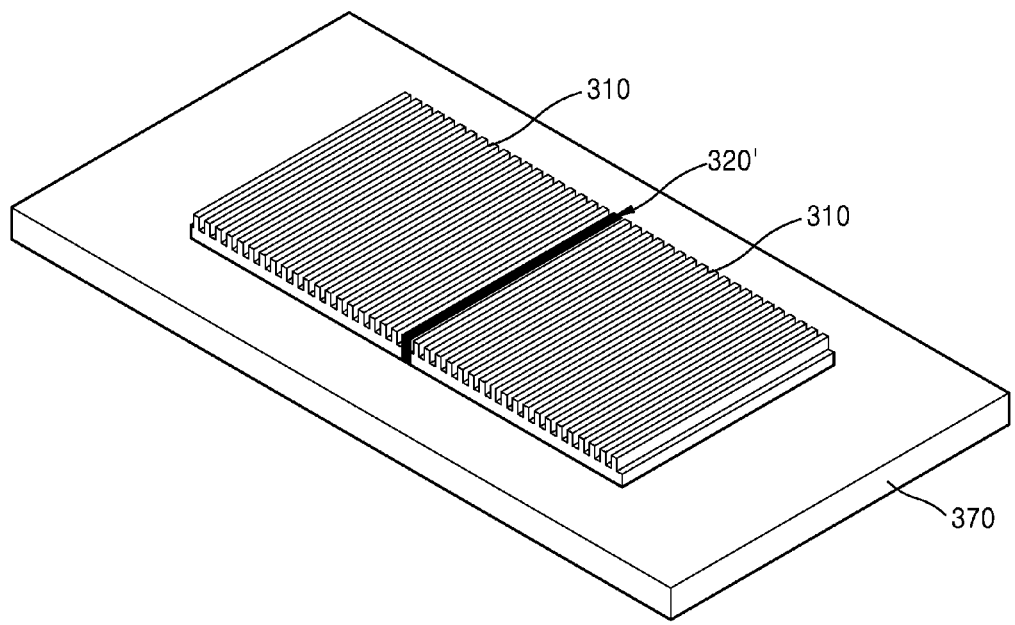

Referring to FIG. 11, a predetermined resin 320' may be inserted in the empty space 315 between the pattern structure units 310. In an exemplary embodiment, the resin 320' is inserted by using a capillary phenomenon in the empty space 315 between the cutting surfaces 313 of the pattern structure units 310 adjacent to each other. In such an embodiment, the resin 320' may have a viscosity that is, for example, less than about 1000 centipoises (cps) to allow the resin 320' in the empty space 315 to be inserted between the pattern structure units 310 using a capillary action. In general, resin having a relatively higher viscosity may be used as the interval between the pattern structure units 310 increases. As resin having a relatively lower viscosity may be used as the interval between the pattern structure units 310 decreases. In one exemplary embodiment, for example, where the interval between the pattern structure units 310 is about hundreds of nanometers, resin having a viscosity equal to or less than about 100 cps may be used, The resin 320' may fill the whole or a part of the empty space 315 between the pattern structure units 310 by a capillary phenomenon.

In an exemplary embodiment, a thermosetting resin or a photocurable resin may be used as the resin 320'. In one exemplary embodiment, for example, the resin 320' may include an acrylate-based material. In an exemplary embodiment, a thermo-shrinking resin or a photo-shrinking resin may be used as the resin 320'. In one exemplary embodiment, for example, the resin 320' may include a polyurethane-based material.

Figure 12:
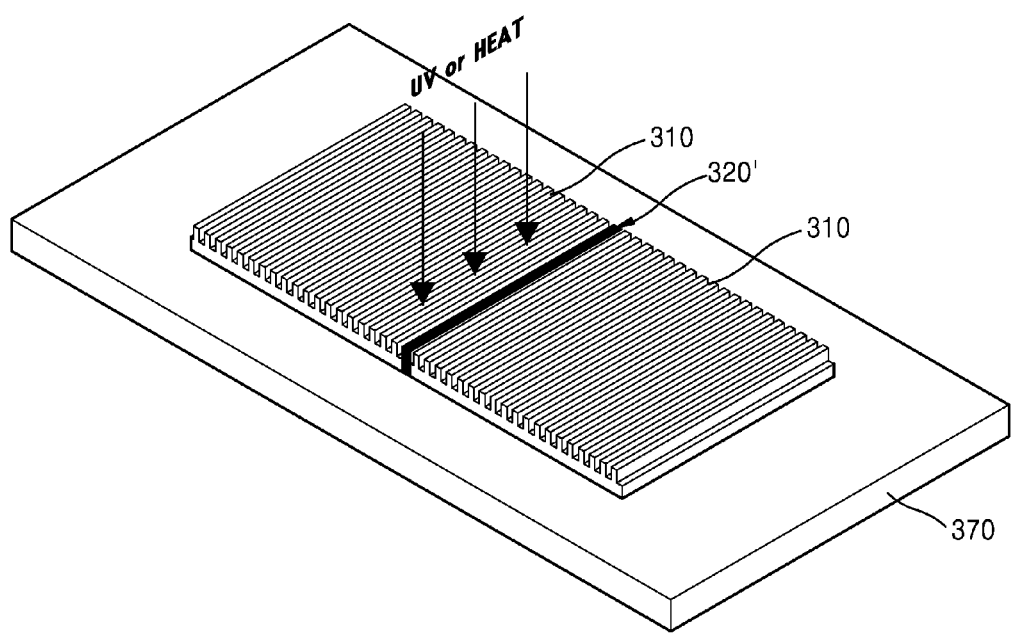
Figure 13:
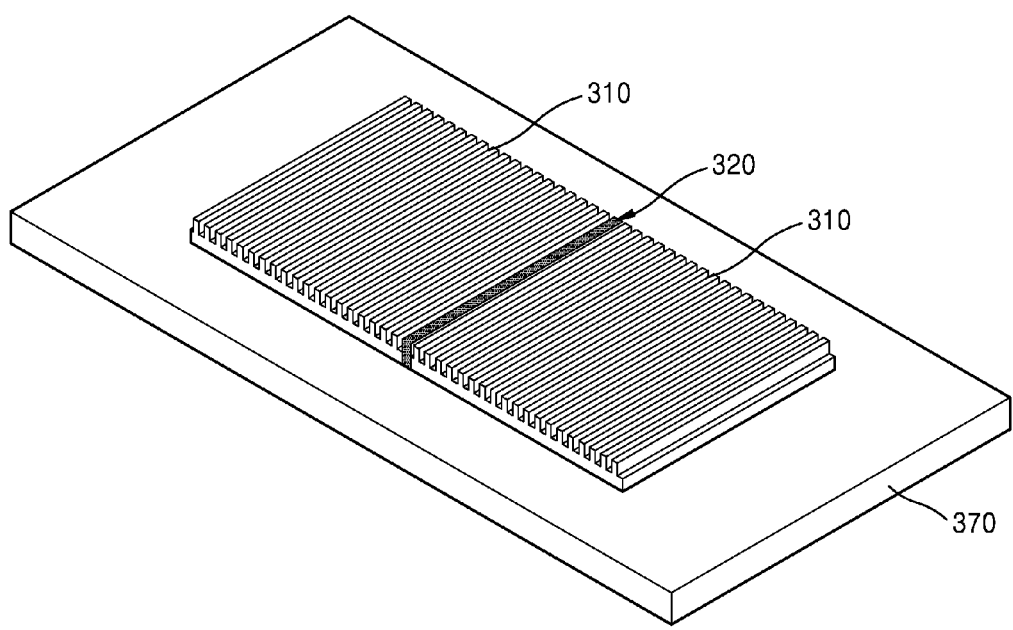

Referring to FIG. 12, heat or light, for example, an ultraviolet ("UV") light, is applied to the resin 320' inserted between the pattern structure units 310. In one exemplary embodiment, for example, where a thermosetting resin or a photocurable resin is used as the resin 320', and heat or light may be applied to the resin 320' inserted between the pattern structure units 310, to cure the resin 320' by a cross link reaction, and thereby forming the connection layer 320 that connects the pattern structure units 310 as shown in FIG. 13. The connection layer 320 formed through the curing process of the resin 320' connects the pattern structure units 310 to each other.

In one exemplary embodiment, for example, where the thermo-shrinking resin or photo-shrinking resin is used as the resin 320', and heat or light is applied to the resin 320' inserted between the pattern structure units 310, a solvent in the resin 320' evaporates and the resin 320' is compressed, thereby forming the connection layer 320 that connects the pattern structure units 310 as shown in FIG. 13. The connection layer 320 formed as passing through the shrinkage process of the resin 320' may combine the pattern structure units 310 to each other.

FIG. 13 illustrates a state in which resin 320' inserted between the pattern structure units 310 is cured or shrunk to form the connection layer 320 that combines the pattern structure units 310. In an exemplary embodiment, the connection layer 320 may have a width corresponding to the interval between the bonding surfaces of the pattern structure units 310 adjacent to each other. In such an embodiment, the connection layer 320 may have a width of less than about 10 μm.

Figure 14:
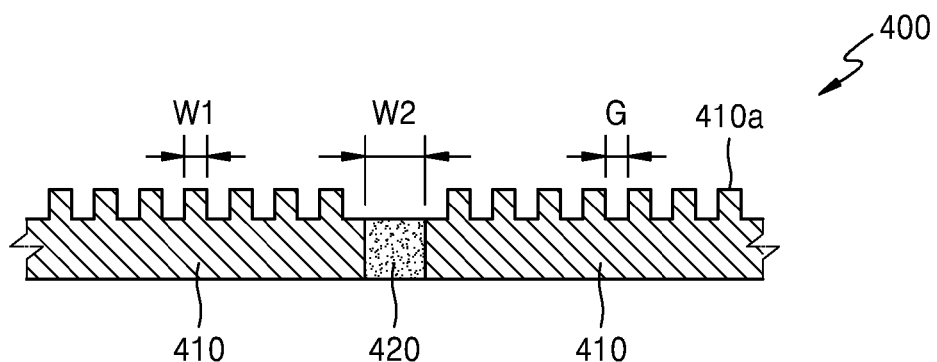
FIGS. 14 to 22 are cross-sectional views showing an exemplary embodiment of a method of manufacturing a metal wire grid polarizer.

FIGS. 14 to 22 are cross-sectional views showing an exemplary embodiment of a method of manufacturing a metal WGP. FIG. 14 illustrates a method of manufacturing a metal WGP using an exemplary embodiment of the pattern structure described herein as a master.

Referring to FIG. 14, in an exemplary embodiment, a master 400 is prepared. In an exemplary embodiment, the master 400 is substantially the same as an exemplary embodiment of the pattern structure 100 described above with reference to FIG. 1. In such an embodiment, the master 400 may include a plurality of maser units 410 arranged substantially on the same plane and a connection layer 420 provided between the master units 410. The master units 410 may include, for example, silicon (Si) or glass. Each of the master units 410 includes microstructures 410a, each protruding from an upper surface of each of the master units 410, and the microstructures 410a may have a width of less than about 1 μm. In an exemplary embodiment, the microstructures 410a may be arranged substantially parallel to each other with regular intervals on the upper surface of each of the master units 410 with a width W1 of less than about 1 μm. In such an embodiment, an interval between the microstructures 410a may be less than about 1 μm and a height of each of the microstructures 410a may be less than about 1 μm.

The master units 410 are arranged substantially on the same plane to be adjacent or close to each other. The connection layer 420 is provided between the master units 410. The connection layer 420 combines the master units 410 to connect the master units 410 with each other. A width W2 of the connection layer 420 may be less than about 10 μm. In an exemplary embodiment, the connection layer 420 may include a thermosetting resin or a photocurable resin. In such an embodiment, the connection layer 420 may include a thermo-shrinking resin or a photo-shrinking resin.

Figure 15:
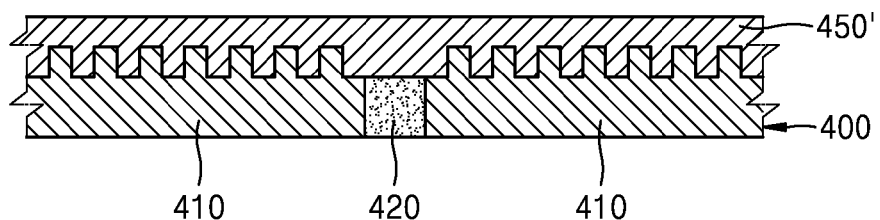
Figure 16:
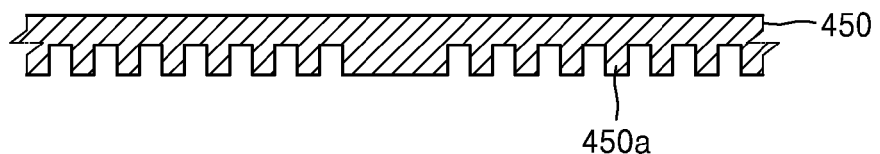

Referring to FIG. 15, in an exemplary embodiment, a mold material 450' is coated on the master 400 and then cured. Next, as illustrated in FIG. 16, the master 400 may be detached and thus a mold 450 for an imprint process that is described below is provided. Mold patterns 450a corresponding to the microstructures 410a of the master 410 are formed on the mold 450.

Figure 17:
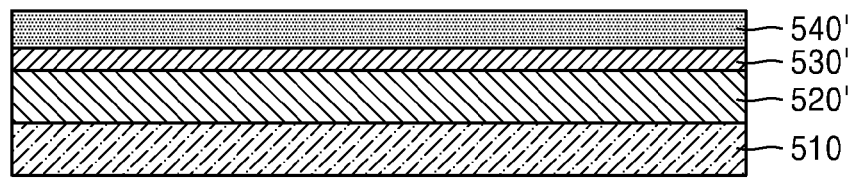

Referring to FIG. 17, in an exemplary embodiment, a metal layer 520', a hard mask 530' and a resin layer 540' are sequentially provided on a support substrate 510. In one exemplary embodiment, for example, a glass substrate may be used as the support substrate 510 and aluminum (Al) may be used as the metal layer 520. In such an embodiment, the hard mask 530' may include a hard material and the resin layer 540' may include a flexible photocurable material.

Figure 18:
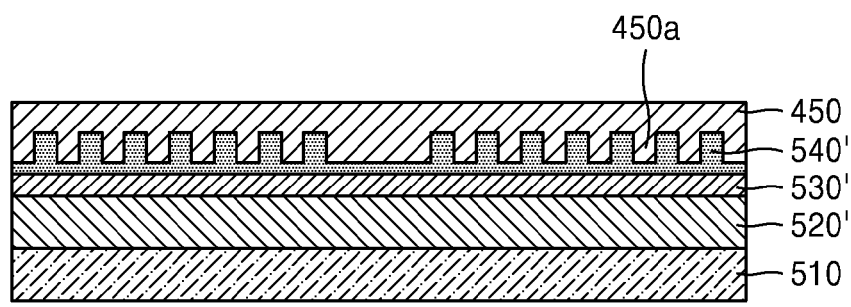
Figure 19:
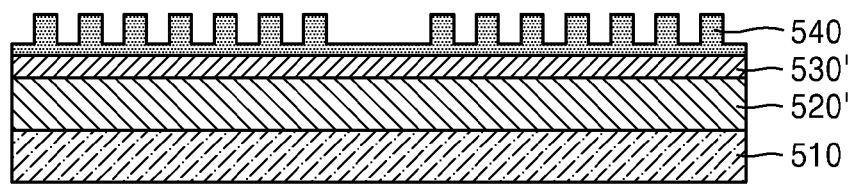

Referring to FIG. 18, in an exemplary embodiment, the mold 450 manufactured as illustrated in FIG. 16 is closely pressed toward the resin layer 540' of FIG. 17. Accordingly, the resin layer 540' having flexibility fills a gap between the model patterns 450a formed on the mold 450. In such an embodiment, when light, for example, a UV light, is irradiated onto the resin layer 540' in a state in which the resin layer 540' fills the gap between the model patterns 450a formed on the mold 450, the resin layer 540' is cured. Next, the mold 450 is detached, as illustrated in FIG. 19, and a patterned resin layer 540 is thereby provided on the hard mask 530'.

Figure 20:
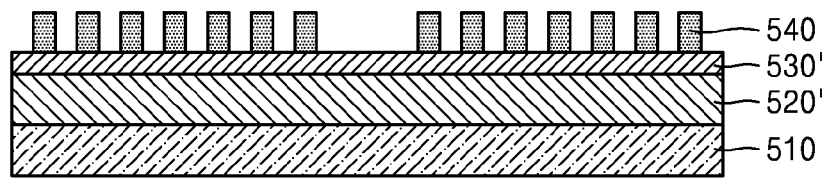
Figure 21:
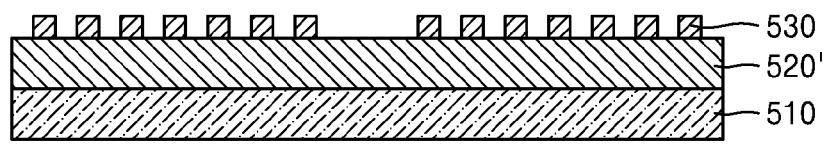

Referring to FIG. 20, in an exemplary embodiment, the resin material remaining on the hard mask 530' is removed by an etching process using the patterned resin layer 540 as a mask. In such an embodiment, referring to FIG. 21, after patterning the hard mask 530' using the patterned resin layer 540 as a mask, the patterned resin layer 540 is removed. In such an embodiment, referring to FIG. 22, after patterning the metal layer 520' using a patterned hard mask 530 as a mask, the patterned hard mask 530 is removed and thus a metal WGP 500 including the support substrate 510 and a plurality of metal wire patterns 520 on the support substrate 510 is provided.

Figure 22:
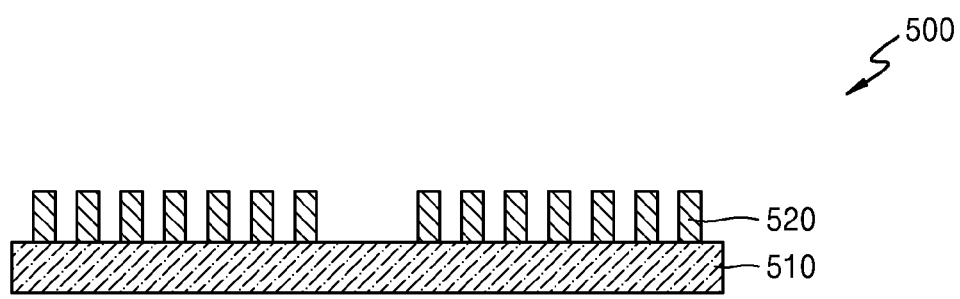
Figure 23:
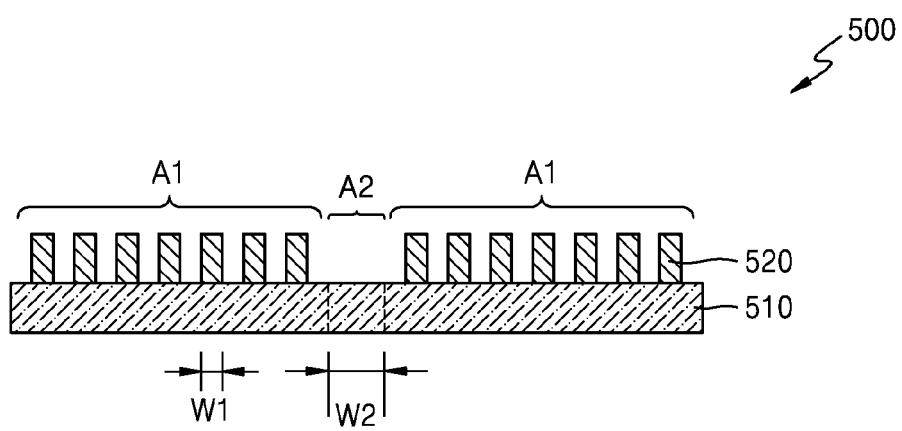
FIG. 23 is an enlarged cross-sectional view of an exemplary embodiment of the metal wire grid polarizer manufactured by a method shown in FIGS. 14 to 22.

FIG. 23 is an enlarged cross-sectional view of an exemplary embodiment of the metal WGP 500 of FIG. 22 manufactured by a method described with reference to FIGS. 14 to 22.

Referring to FIG. 23, the metal WGP 500 may include the support substrate 510 and the metal wire patterns 520 provided on the support substrate 510. For example, the support substrate 510 may include glass and the metal wire patterns 520 may include aluminum (Al).

The metal WGP 500 may have substantially the same shape as that of the master 400 of FIG. 14. In an exemplary embodiment, the metal WGP 500 may include a plurality of pattern areas A1 including metal wire patterns 520 and a seam area A2 disposed between the pattern areas A1. The pattern areas A1 may correspond to the master units 410 of the master 400 of FIG. 14. Accordingly, the metal wire patterns 520 in the pattern areas A1 may have the shapes corresponding to the microstructures 410a of the master unit 410. Accordingly, each of the metal wire patterns 520 may have a width W1 of less than about 1 μm. Also, an interval between the metal wire patterns 520 may be less than about 1 μm and a height of each of the metal wire patterns 520 may be less than about 1 μm. The seam area A2 may correspond to the connection layer 420 of the master 400 of FIG. 14. Accordingly, the seam area A2 may have a width W2 of less than about 10 μm, but greater than the width W1 of the metal wire patterns 520.

Figure 24:
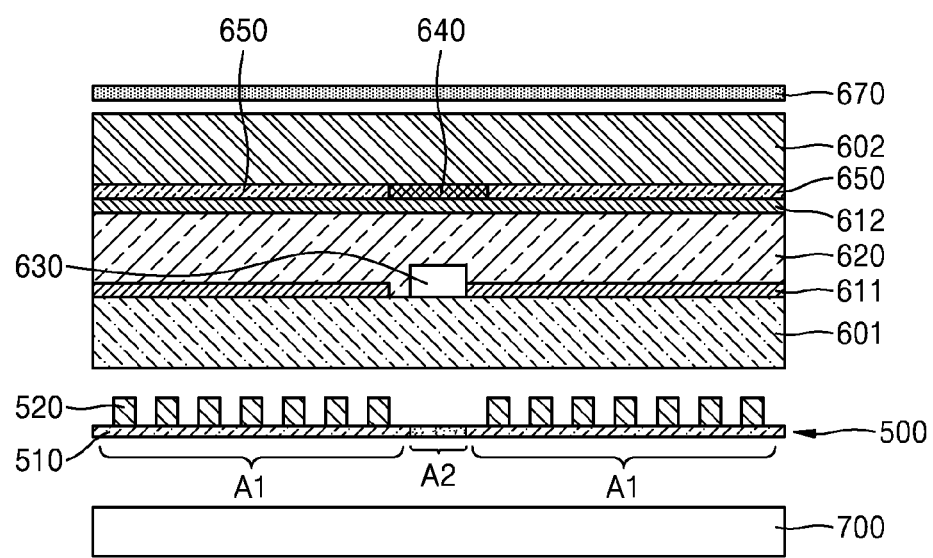
FIG. 24 is a cross-sectional view showing an exemplary embodiment of a liquid crystal display device.

FIG. 24 is a cross-sectional view illustrating an exemplary embodiment of a LCD device. FIG. 24 illustrates a LCD device including the metal WGP 500 of FIG. 23.

Referring to FIG. 24, an exemplary embodiment of the LCD includes first and second substrates 601 and 602 disposed opposite to each other and a liquid crystal layer 620 disposed between the first and second substrates 601 and 602. The first and second substrates 601 and 602 may be lower and upper substrate, respectively. The first and second substrates 601 and 602 may include a transparent material such as glass. A backlight unit 700 for emitting light of a predetermined color, for example, a white light, toward the liquid crystal layer 620 is disposed under the first substrate 601.

In such an embodiment, the metal WGP 500 is disposed on the first substrate 601. In one exemplary embodiment, for example, the metal WGP 500 may be disposed between the back light unit 700 and the first substrate 601. However, the metal WGP 500 may be disposed above an upper surface of the first substrate 601 in an alternative exemplary embodiment.

The metal WGP 500 may include the support substrate 510 and the metal wire patterns 520 on the support substrate 510. In such an embodiment, as described above, the metal WGP 500 includes the pattern areas A1 including the metal wire patterns 520 and the seam area A2 disposed between the pattern areas A1. Each of the metal wire patterns 520 may have a width of less than about 1 μm. The seam area A2 may have a width of less than about 10 μm.

In such an embodiment, the LCD may further include a plurality of first electrodes 611 and a plurality of thin film transistors ("TFT"s) 630 for driving the first electrodes 611, which are disposed on the first substrate 601. The first electrodes 611 may be pixel electrodes. In such an embodiment, a second electrode 612 is disposed on the second substrate 602. The second electrode 612 may be a common electrode.

In such an embodiment, the LCD may further include a plurality of color filters 650 disposed on the second substrate 602 to correspond to the first electrode 611. Each of the color filters 650 may have a predetermined color, for example, one of primary colors such as red, green or blue. In such an embodiment, the LCD may further include a black matrix 640 disposed between the color filters 650. The black matrix 640 may effectively prevent cross talk between the pixels and improve contrast. In such an embodiment, the LCD may further include a polarizer 670 disposed on the second substrate 602. In an exemplary embodiment, the polarizer 670 may be provided on an upper surface of the second substrate 602. In an exemplary embodiment, a PVA polarizer, that is, an absorptive polarizer, for example, may be used as the polarizer 670.

In an exemplary embodiment of the LCD device, the seam area A2 of the metal WGP 500 is disposed at a position corresponding to the black matrix 640. In one exemplary embodiment, for example, the seam area A2 of the metal WGP 500 is disposed under the black matrix 640. The width of the seam area A2 may be smaller than the width of the black matrix 640. In such an embodiment, where the seam area A2 having a width that is less than that of the black matrix 640 is located under the black matrix 640, the seam area A2 of the metal WGP 500 is covered by the black matrix 640 and thus a seamless image may be embodied in a large size. In such an embodiment where a large-sized, for example, more than 55 inches, LCD include the metal WGP 500 having the seam area A2 having a width of less than about 10 μm as described above and the seam area A2 of the metal WGP 500 is located under the black matrix 640, a seamless image may be effectively embodied in such a large-sized LCD.

In an exemplary embodiment, the large-sized pattern structure may be applied to the metal WGP in which the microstructures are arranged substantially parallel to each other with regular intervals. In an alternative exemplary embodiment, the large-sized pattern structure may be variously modified to have a shape to be used in various fields other than the metal WGP.

As described above, a large-sized pattern structure may be manufactured by combining the pattern structure units including the microstructures having a width of less than about 1 μm using the connection layer to connect the pattern structure units to each other. In such an embodiment, where the connection layer has a width of less than about 10 μm, a sense of disconnection may be effectively prevented from occurring in the seam portion, that is, the microstructures may look substantially continuously arranged in the large-sized pattern structure. Accordingly, when the pattern structure is used as the master, a large-sized metal WGP having uniform physical properties across the entire area thereof may be effectively manufactured without defects. Also, an exemplary embodiment of the LCD device may include the large-sized metal WGP, and the seam area of the metal WGP has a width that is less than that of the black matrix and the seam area is located under the black matrix and thus an image having no defect may be embodied in a large size. Such an embodiment of the large-sized pattern structure may be applied to various fields other than the metal WGP.

Figure 25:
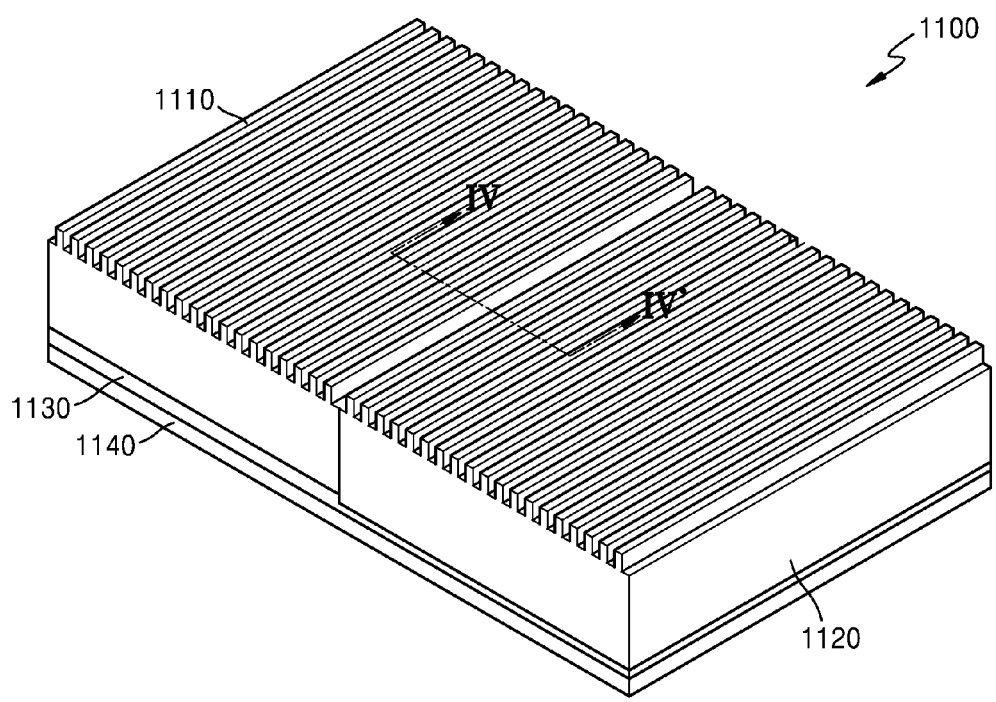
FIG. 25 is a perspective view illustrating an exemplary embodiment of a pattern structure.
Figure 26:
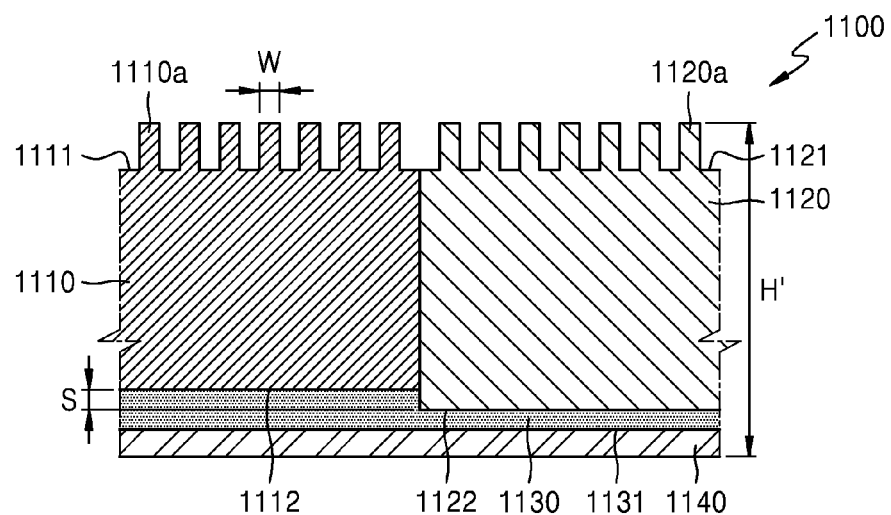
FIG. 26 is a cross-sectional view taken along line IV-IV' of FIG. 25.

FIG. 25 is a perspective view illustrating an alternative exemplary embodiment of a pattern structure 1100. FIG. 26 is a cross-sectional view taken along line IV-IV' of FIG. 25.

Referring to FIGS. 25 and 26, an exemplary embodiment of the pattern structure 1100 may include the first and second pattern structure units 1110 and 1120 arranged substantially on a same plane, a flattening layer 1130 disposed on the first and second pattern structure units 1110 and 1120, and a substrate 1140 disposed on the flattening layer 1130. In such an embodiment, a surface of the first pattern structure unit 1110 and a surface of the second pattern structure unit 1120 may be disposed in the same plane.

The first pattern structure unit 1110 may include a first surface 1111 (e.g., an upper surface in FIG. 25) and a second surface 1112 (e.g., a lower surface in FIG. 25) which are opposite to each other. A plurality of first microstructures 1110*a* protrudes from the first surface 1111 of the first pattern structure unit 1110. A width W of each of the first microstructures 1110*a* may be less than, for example, about 1 μm. In such an embodiment, the first microstructures 1110*a* may be arranged with a predetermined pattern and substantially parallel to each other, e.g., with a width W of less than about 1 μm, on the first surface 1111 of the first pattern structure unit 1110. In such an embodiment, the first microstructures 1110*a* may be arranged with a constant interval, and the interval between the microstructures 1110*a* may be less than about 1 μm, and a height of each of the first microstructures 1110*a* may be less than about 1 μm. However, the shape of the first microstructures 1110*a* in an exemplary embodiment is not limited to the shapes described above, and the first microstructures 1110*a* may be modified to various shapes other than the above-described shape.

In an exemplary embodiment, the first pattern structure unit 1110 may include or be formed of, for example, silicon (Si) or glass. In such an embodiment, the first pattern structure unit 1110 may be manufactured by forming the first microstructures 1110*a* on a silicon wafer or a glass wafer using a patterning process. In an exemplary embodiment, the first pattern structure unit 1110 may be formed of resin, for example, polyethylene phthalate ("PET"), N,N-dimethylacrylamide ("PDMA"), or polycarbonate ("PC"). In such an embodiment, the first pattern structure unit 1110 may be manufactured by forming the first microstructures 1110a by an imprint process. The first pattern structure unit 1110 may include various materials other than the above-described material.

The second pattern structure unit 1120 may include a first surface 1121 (e.g., an upper surface in FIG. 25) and a second surface 1122 (e.g., a lower surface in FIG. 25) which are opposite to each other. A plurality of second microstructures 1120a protrudes from the first surface 1121 of the second pattern structure unit 1120. A width W of each of the second microstructures 1120a may be less than about 1 μm, as in the first microstructures 1110a. The second pattern structure unit 1120 may include or be formed of, for example, silicon (Si), glass, or resin.

The first and second pattern structure units 1110 and 1120 are arranged on the same plane adjacent to each other. In such an embodiment, the first surface 1111 of the first pattern structure unit 1110 and the first surface 1121 of the second pattern structure unit 1120 may be disposed in a same plane, as shown in FIG. 26. The first microstructures 1110a on the first surface 1111 of the first pattern structure unit 1110 and the second microstructures 1120a on the first surface 1121 of the second pattern structure unit 1120 may have the same level or height H' with respect to a reference plane therebelow, e.g., a lower surface of the a substrate disposed therebelow 1140. In such an embodiment, as illustrated in FIG. 26, as the upper surfaces of the first microstructures 1110a and the upper surfaces of the second microstructures 1120a are located at the same level or height H", the upper surfaces may be flat with respect to each other. Accordingly, no vertical step difference may be generated between the first microstructures 1110a and the second microstructures 1120a.

In such an embodiment, a vertical step difference S may exist between the second surface 1112 of the first pattern structure unit 1110 and the second surface 1122 of the second pattern structure unit 1120. The vertical step difference S may be generated due to a difference in the thickness between the first pattern structure unit 1110 and the second pattern structure unit 1120. In one exemplary embodiment, for example, the pattern structure units may be manufactured by using wafers, each having a thickness in a range of about 400 μm to about 800 μm, and a predetermined thickness deviation in a range of about 20 μm to about 30 μm may exist between the wafers. Accordingly, a thickness deviation may exist between the pattern structure units manufactured on the wafers an, such that a vertical step difference may be generated due to a difference in the thickness between the pattern structure units when the pattern structure units are arranged adjacent to each other.

In an exemplary embodiment, the flattening layer 1130 may be disposed to cover the second surface 1112 of the first pattern structure unit 1110 and the second surface 1122 of the second pattern structure unit 1120 having a vertical step difference. The flattening layer 1130 connects the first pattern structure unit 1110 and the second pattern structure unit 1120 and effectively prevents a vertical step difference from being generated between the first microstructures 1110a and the second microstructures 1120a. In such an embodiment, the flattening layer 1130 may include, for example, a thermosetting resin or a photocurable resin. The thermosetting resin or photocurable resin may include, for example, an acrylate-based material. A substrate 1140 may be provided on a lower surface 1131 of the flattening layer 1130. The substrate 1140 may be flat and may include a relatively hard material. Accordingly, the lower surface 1131 of the flattening layer 1130 contacting the substrate 1140 may be substantially flat.

In an exemplary embodiment, as described above, the two pattern structure units 1110 and 1120 are arranged on the same plane in one dimension. In an alternative exemplary embodiment, three or more pattern structure units may be arranged substantially on the same plane substantially in a matrix form. In such an embodiment, the microstructures of the pattern structure units are all disposed at the same level or height, and a vertical step difference due to a difference in the thickness may exist between at least two of the pattern structure units.

As described above, in an exemplary embodiment of the pattern structure 1100, a vertical step difference S due to a difference in the thickness between the first pattern structure unit 1110 and the second pattern structure unit 1120 may be generated. However, in such an embodiment, the flattening layer 1130 may be provided on the first and second pattern structure units 1110 and 1120, and the first microstructures 1110a of the first pattern structure unit 1110 and the second microstructures 1120a of the second pattern structure unit 1120 may be located at the same level or height H'. In general, when a difference in the height exists between the pattern structures, uniformity of the entire pattern of the pattern structures may be degraded and large-sized patterning may not be effectively preformed with the pattern structures. However, according to an exemplary embodiment of the pattern structure 1100, both the first and second microstructures 1110a and 1120a are provided at the same level or height H' using the flattening layer 1130 and thus a uniform pattern may be effectively embodied in a large size.

Such an embodiment of the pattern structure 1100 may be applied to, for example, a master for manufacturing a stamp or a stamp for imprint. Such an embodiment of the pattern structure 1100 may be directly used as a master for manufacturing a stamp, for example. Also, a stamp for imprint may be manufactured by using such an embodiment of the pattern structure 1100 as a master. When using such an embodiment of the pattern structure 1100 as a master, a large-sized stamp may be manufactured of a flexible film, and a roll type stamp may be thereby embodied.

Recently, as the size of an LCD panel gradually increases, there is a demand to manufacture a metal WGP applied to the LCD panel to be in a large size without defects. Accordingly, when a master or stamp for manufacturing a WGP is manufactured in a large size, a mask or stamp having no defect and uniform physical properties across the entire area may be effectively embodied in a large size by using such an embodiment of the pattern structure. The pattern structure 1100 may be applied to various fields other than the master or stamp.

Figure 27:
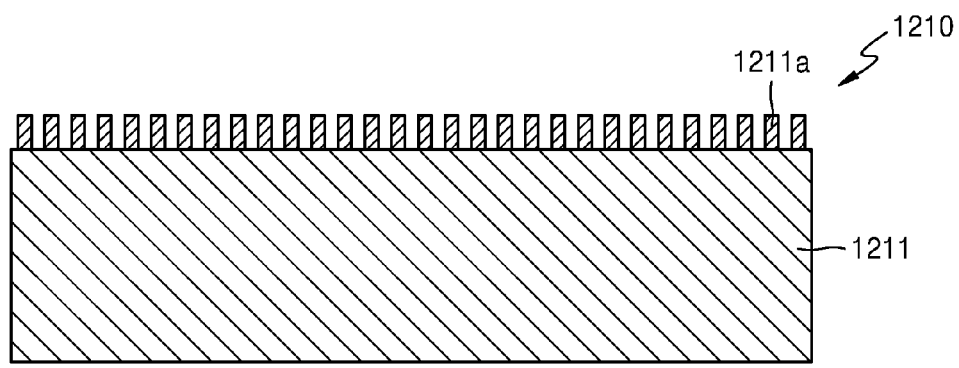
FIG. 27 is a cross-sectional view illustrating an exemplary embodiment of a pattern structure unit used for a pattern structure.

FIG. 27 illustrates an alternative exemplary embodiment of a pattern structure unit of a pattern structure.

Referring to FIG. 27, an exemplary embodiment of the pattern structure unit 1210 may include a substrate 1211 and a plurality of microstructures 1211a disposed on the substrate 1211. In an exemplary embodiment, as shown in FIG. 26, each of the pattern structure units 1110 and 1120 may be may be integrally formed as a single unitary and indivisible unit, e.g., integrally manufactured of the same material. In an alternative exemplary embodiment, as shown in FIG. 27, the substrate 1211 and the microstructures 1211a may include different materials from each other. In one exemplary embodiment, for example, the substrate 1211 may include silicon and the microstructures 1211a may include a silicon oxide. In such an embodiment, the pattern structure unit 1210 may be manufactured by forming the microstructures 1211a on the substrate 1211, e.g., after forming a silicon oxide layer on the substrate 1211 including silicon and then patterning the silicon oxide layer. The substrate 1211 and the microstructures 1211a may include a material other than the above-described material.

Figure 28:
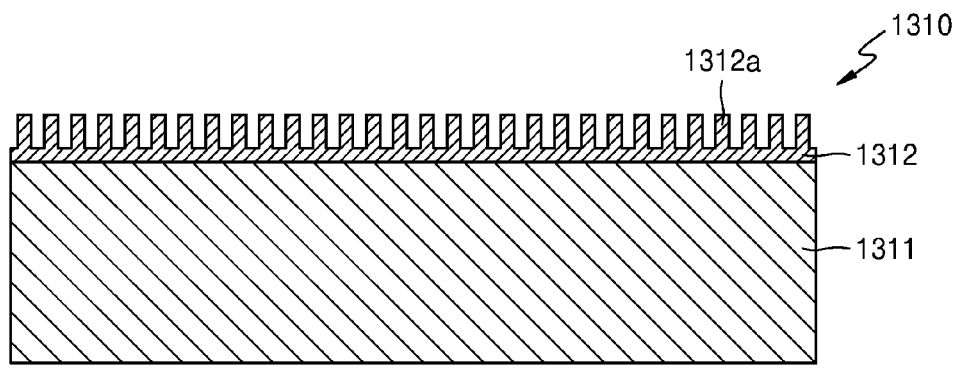
FIG. 28 is a cross-sectional view illustrating an alternative exemplary embodiment of a pattern structure unit used for a pattern structure.

FIG. 28 illustrates another alternative exemplary embodiment of a pattern structure unit of a pattern structure.

Referring to FIG. 28, the pattern structure unit 1310 may include a substrate 1311, and a pattern layer 1312 disposed on the substrate 1311 and including a plurality of microstructures 1312a. The microstructures 1312a protrude from an upper surface of the pattern layer 1312. In one exemplary embodiment, for example, the substrate 1311 may include silicon or glass and the pattern layer 1312 may include resin such as PET, PDMA or PC. In an exemplary embodiment, the pattern structure unit 1310 may be manufactured by coating resin on the substrate 1311 and then forming the microstructures 1312a in an imprint process.

Hereinafter, an exemplary embodiment of a method of manufacturing the pattern structure is described. FIGS. 29 to 36 are cross-sectional views showing an alternative exemplary embodiment of a method of manufacturing a pattern structure.

Figure 29:
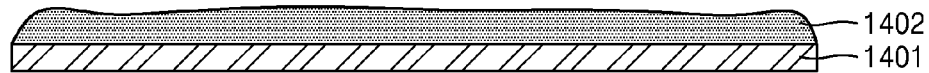
FIGS. 29 to 36 are cross-sectional views showing an exemplary embodiment of a method of manufacturing a pattern structure.

Referring to FIG. 29, in an exemplary embodiment of a method of manufacturing the pattern structure, a first substrate 1401 is prepared and then a first flattening resin 1402 is provided on the first substrate 1401. The first substrate 1401 may include a flat upper surface, and the first flattening resin 1402 may be coated on the flat upper surface of the first substrate 1401. The first flattening resin 1402 may have a predetermined viscosity to flow and be deformed by an external pressure. In such an embodiment, the first flattening resin 1402 may include a material that is not substantially contracted (e.g., not substantially decreased in size or volume by the external pressure) and is imprintable. In such an embodiment, the first flattening resin 1402, as described below, may further include a releasing agent to be easily separate from the first and second microstructures 1410a and 1420a of FIG. 35. The surfaces of the first and second microstructures 1410a and 1420a or a surface of the first flattening resin 1402 may be release-processed. In such an embodiment, the first flattening resin 1402 may include a thermosetting resin or a photocurable resin. In one exemplary embodiment, the thermosetting resin or photocurable resin may include an acrylate-based material, but and the thermosetting resin or photocurable resin may include various other materials.

Figure 30:
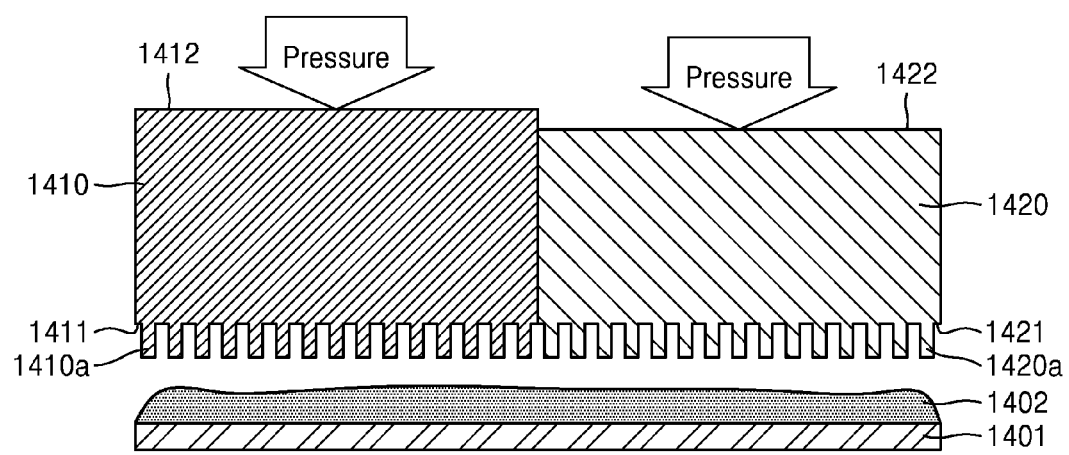

Referring to FIG. 30, the first and second pattern structure units 1410 and 1420 are arranged on the first substrate 1401 that is coated with the first flattening resin 1402. The first and second pattern structure units 1410 and 1420 may be arranged to closely contact each other so that the interval between the first and second pattern structure units 1410 and 1420 may be minimized, e.g., less than about 10 μm. The first pattern structure unit 1410 may include a first surface 1411 (a lower surface in FIG. 30) and a second surface 1412 (an upper surface of FIG. 30) which are opposite surfaces. The first microstructures 1410a protrudes on the first surface 1411 of the first pattern structure unit 1410. The second pattern structure unit 1420 may include a first surface 1421 (a lower surface in FIG. 30) and a second surface 1422 (an upper surface of FIG. 30) which are opposite surfaces. The second microstructures 1420a protrudes on the first surface 1421 of the second pattern structure unit 1420. The first and second pattern structure units 1410 and 1420 may include, for example, silicon (Si), glass, PET, PDMA, or PC. FIG. 30 illustrates an exemplary embodiment in which the first and second pattern structure units 1410 and 1420 are integrally manufactured. However, in an alternative exemplary embodiment, the pattern structure unit 1210 of FIG. 27 or the pattern structure unit 1310 or FIG. 28 may be used.

The first and second pattern structure units 1410 and 1420 may be arranged such that the first and second microstructures 1410a and 1420a face the upper surface of the first substrate 1401. The first pattern structure unit 1410 and the second pattern structure unit 1420 may have different thicknesses. Next, while the first and second pattern structure units 1410 and 1420 are arranged on the first substrate 1401 that is flat, the first and second pattern structure units 1410 and 1420 are pressed by a predetermine pressure to closely contact the first flattening resin 1402.

Figure 31:
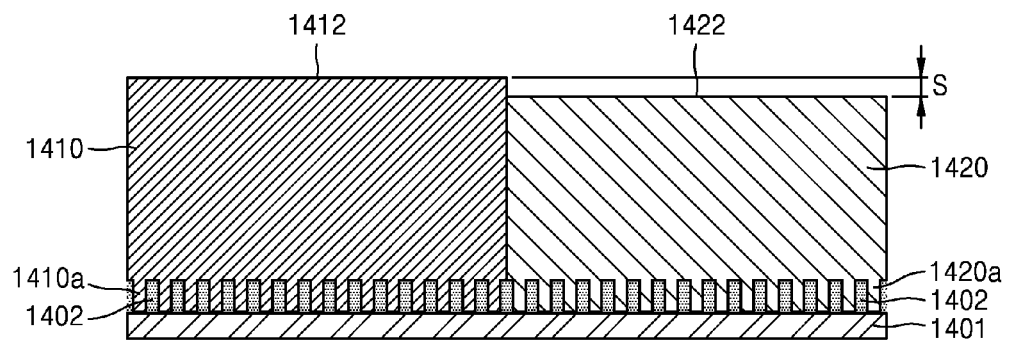

Referring to FIG. 31, as described above, when the first and second pattern structure units 1410 and 1420 is pressed against the first flattening resin 1402 by a predetermined pressure to closely contact the first flattening resin 1402, the first flattening resin 1402 coated on the first substrate 1401 flows to fill gaps between the first microstructures 1410a and gaps between the second microstructures 1420a. The first flattening resin 1402 filling the gaps may fix the first and second pattern structure units 1410 and 1420. When the pressure applied to the first and second pattern structure units 1410 and 1420 is adjusted, the first microstructures 1410a and the second microstructures 1420a may be provided substantially parallel to the flat upper surface of the first substrate 1402. Accordingly, the lower surface of the first microstructures 1410a and the lower surface of the second microstructures 1420a may collectively define a substantially flat surface corresponding to the upper surface of the first substrate 1401. In such an embodiment, as the lower surface of the first microstructures 1410a and the lower surface of the second microstructures 1420a are located at substantially the same level or height, a vertical step difference may not be generated between the first microstructures 1410a and the second microstructures 1420a. A predetermined vertical step difference S may be generated between the second surface 1412 of the first pattern structure unit 1410 and the second surface 1422 of the second pattern structure unit 1420 due to a difference in the thickness between the first and second pattern structure units 1410 and 1420.

Figure 32:
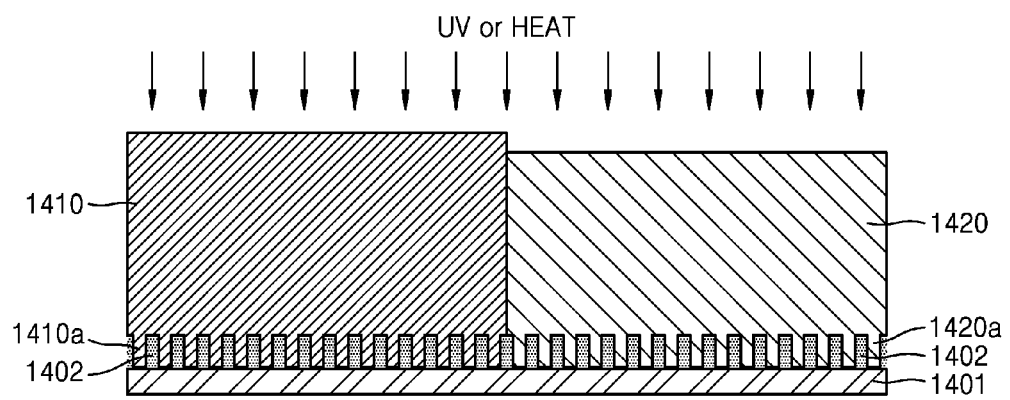

Referring to FIG. 32, the first flattening resin 1402 filling a gap between the first and second microstructures 1410a and 1420a as illustrated in FIG. 31 is cured. In an exemplary embodiment, where the first flattening resin 1402 includes photocurable resin, light, for example, a UV light, is irradiated onto the first flattening resin 1402 to cure the first flattening resin 1402. In an alternative exemplary embodiment, where the first flattening resin 1402 includes thermosetting resin, heat is applied to the first flattening resin 1402 to cure the first flattening resin 1402. In such an embodiment, as the first flattening resin 1402 is cured, the first and second pattern structure units 1410 and 1420 may be more firmly fixed on the first substrate 1401. In an alternative exemplary embodiment, the above-described process of curing the first flattening resin 1402 may be omitted. In an alternative exemplary embodiment, the process of coating the first flattening resin 1402 on the first substrate 1401 and curing the first flattening resin 1402 described above may be omitted. In such an embodiment, only the first and second pattern structure units 1410 and 1420 may be arranged on the first substrate 1401 that is flat.

Figure 33:
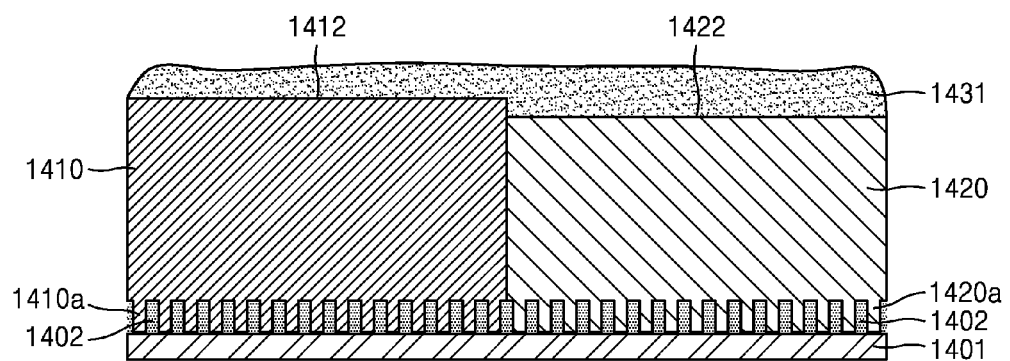

Referring to FIG. 33, a second flattening resin 1431 is coated on the second surface 1412 of the first pattern structure unit 1410 and the second surface 1422 of the second pattern structure unit 1420. As described above, a vertical step difference S may exist between the second surface 1412 of the first pattern structure unit 1410 and the second surface 1422 of the second pattern structure unit 1420. The second flattening resin 1431 is coated to a predetermined thickness to cover the second surface 1412 of the first pattern structure unit 1410 and the second surface 1422 of the second pattern structure unit 1420 having the vertical step difference S.

The second flattening resin 1431 may have a predetermine viscosity to flow and be deformable by an external pressure. The second flattening resin 1431 may include a material having high adhesion to the first and second pattern structure units 1410 and 1420 or a second substrate 1440 of FIG. 34, as described below. In an exemplary embodiment, an adhesive layer is additionally provided between the second flattening resin 1431 and the first and second pattern structure units 1410 and 1420, or between the second flattening resin 1431 and the second substrate 1440. The second flattening resin 1431 may include a thermosetting resin or a photocurable resin. In one exemplary embodiment, the thermosetting resin or photocurable resin may include, an acrylate-based material, but the thermosetting resin or photocurable resin may include various other materials.

Figure 34:
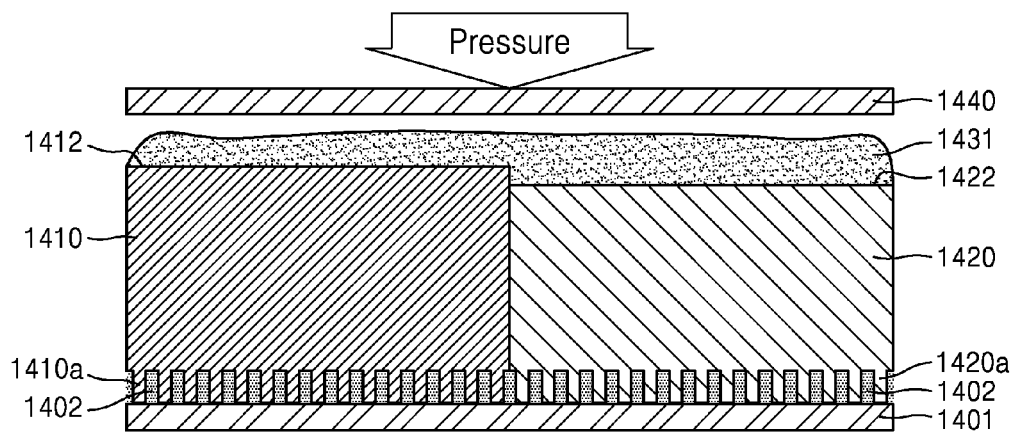
Figure 35:
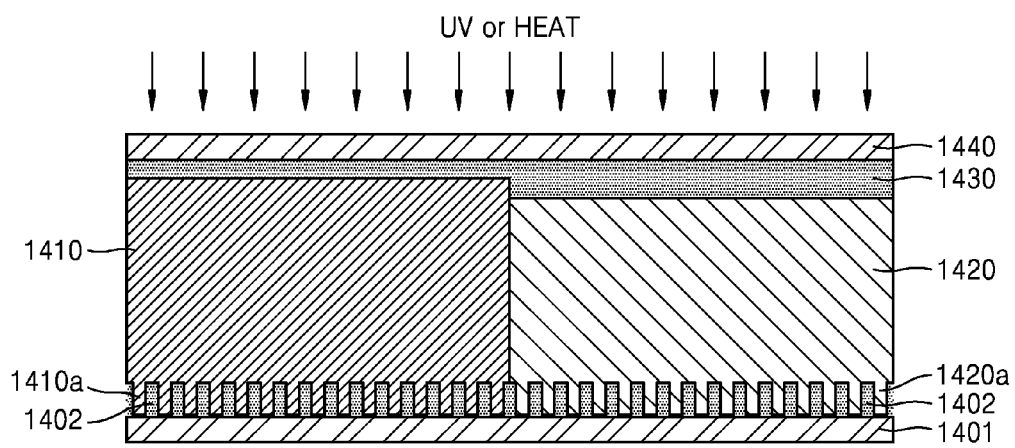

Referring to FIG. 34, the second substrate 1440 having a flat surface is provided above the second flattening resin 1431. Next, the second substrate 1440 is pressed by a predetermined pressure to closely contact the second flattening resin 1431. Accordingly, as illustrated in FIG. 35, a flattening layer 1430 that connects the first and second pattern structure units 1410 and 1420 may be formed between the first and second pattern structure units 1410 and 1420 and the second substrate 1440. Although the vertical step difference S exists between the second surface 1412 of the first pattern structure unit 1410 and the second surface 1422 of the second pattern structure unit 1420 contacting the flattening layer 1430, the upper surface of the flattening layer 1430 contacting the second substrate 1440 is flattened due to the second substrate 1440, such that no vertical step difference is generated on the upper surface of the flattening layer 1430. The flattening layer 1430 having adhesion properties may connect the second substrate 1440 and the first and second pattern structure units 1410 and 1420.

Next, the second flattening resin 1431 may be cured. In one exemplary embodiment, where the second flattening resin 1431 includes photocurable resin, light, for example, a UV light, is irradiated onto the second flattening resin 1431 to cure the second flattening resin 1431, thereby forming the flattening layer 1430. In an alternative exemplary embodiment, where the second flattening resin 1431 includes thermosetting resin, heat is applied to the second flattening resin 1431 to cure the second flattening resin 1431, thereby forming the flattening layer 1430. In such an embodiment, as the flattening layer 1430 is formed, the first pattern structure unit 1410 and the second pattern structure unit 1420 may be more firmly connected to each other. In such an embodiment, the second substrate 1440 and the first and second pattern structure units 1410 and 1420 may be firmly connected to each other.

Figure 36:
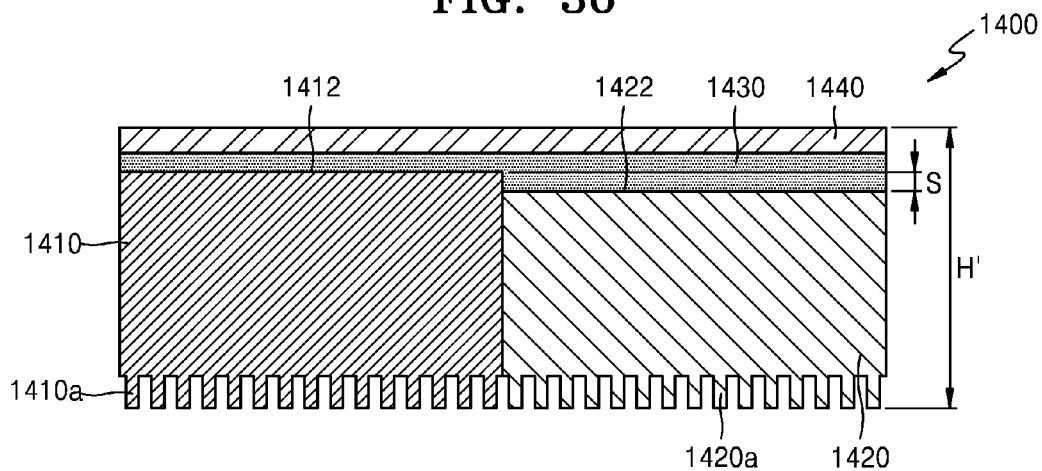

Referring to FIG. 36, as the first flattening resin 1402 that is formed and cured on the first substrate 1401 is detached from the first and second pattern structure units 1410 and 1420, a pattern structure 1400 may be formed. As described above, the first flattening resin 1402 may include a release agent to facilitate separation of the first flattening resin 1402. Also, the surfaces of the first and second microstructures 1410*a* and 1420*a* or the surface of the first flattening resin 1402 may be release-processed.

According to exemplary embodiments as set forth herein, as the flatting layer is provided on the pattern structure units having a vertical step difference, the microstructures formed on the pattern structure units are all located at the same level or height. Accordingly, a pattern structure that embodies a uniform pattern in a large size may be manufactured.

It should be understood that the exemplary embodiments described herein should be considered in a descriptive sense only and not for purposes of limitation. Descriptions of features or aspects within each embodiment should typically be considered as available for other similar features in other embodiments.

While one or more embodiments have been described with reference to the figures, it will be understood by those of ordinary skill in the art that various changes in form and details may be made therein without departing from the spirit and scope as defined by the following claims.

What is claimed is:

1. A pattern structure comprising:
a plurality of pattern structure units arranged on a same plane, wherein each of the plurality of pattern structure units comprises a plurality of microstructures defined on a surface thereof and each having a width of less than about 1 micrometer; and
a connection layer formed of a resin disposed between the plurality of pattern structure units and having a width of less than about 10 micrometers, wherein the connection layer connects the plurality of pattern structure units to each other.

2. The pattern structure of claim 1, wherein the plurality of microstructures is arranged substantially parallel to each other with regular intervals.

3. The pattern structure of claim 1, wherein a surface of each of the plurality of pattern structure units, which is connected to the connection layer, has a maximum roughness of less than about 10 micrometers.

4. The pattern structure of claim 1, wherein a vertical step difference between surfaces of the plurality of pattern structure units is less than about 10% of the width of each of the plurality of microstructures.

5. The pattern structure of claim 1, wherein the resin comprises a thermosetting resin or a photocurable resin.

6. The pattern structure of claim 1, wherein the resin comprises a thermo-shrinking resin or a photo-shrinking resin.

7. The pattern structure of claim 1, wherein the plurality of pattern structure units comprises silicon (Si) or glass.

8. The pattern structure of claim 1, wherein the plurality of pattern structure units is arranged substantially in a matrix form.

9. A method of manufacturing a pattern structure, the method comprising:
preparing a plurality of pattern structure units, wherein a plurality of microstructures has a width less than about 1 micrometer are defined on a surface of each of the plurality of pattern structure units;
arranging the plurality of pattern structure units on a same plane to be adjacent to one another; and
providing a connection layer formed of a resin between the plurality of pattern structure units to combine the plurality of pattern structure units with each other, and wherein an interval between adjacent bonding surfaces of the plurality of pattern structure units is less than about 10 micrometers.

10. The method of claim 9, wherein a surface of each of the plurality of pattern structure units, which is connected to the connection layer, has a maximum roughness of less than about 10 micrometers.

11. The pattern structure of claim 9, wherein a vertical step difference between surfaces of the plurality of pattern structure units is less than about 10% of the width of each of the plurality of microstructures.

12. The method of claim 9, wherein a viscosity of the resin is less than about 1000 centipoises.

13. The method of claim 9, wherein the resin comprises a thermosetting resin or a photocurable resin.

14. The method of claim 9, wherein the resin comprises a thermo-shrinking resin or a photo-shrinking resin.

15. The method of claim 9, wherein the providing the connection layer comprises:
   inserting the resin between the plurality of pattern structure units using a capillary phenomenon; and
   forming the connection layer by curing or shrinking the resin.

16. The method of claim 9, wherein the preparing the plurality of pattern structure units comprises cutting a plurality of pattern wafers having a surface on which the plurality of microstructures is defined.

17. The method of claim 16, wherein the cutting the plurality of pattern wafers comprises performing an etching process, a laser process or a polishing process.

* * * * *